US012713972B2

United States Patent
(12) United States Patent
Huang et al.

(10) Patent No.: US 12,713,972 B2
(45) Date of Patent: Aug. 18, 2026

(54) FORMING STRUCTURES IN EMPTY REGIONS ON WAFERS WITH DUAL SEAL RING STRUCTURES

(71) Applicant: Taiwan Semiconductor Manufacturing Company, Ltd., Hsin-Chu (TW)

(72) Inventors: Shan-Yu Huang, Zhubei City (TW); Yilun Chen, Hsinchu (TW); Huang-Sheng Lin, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 697 days.

(21) Appl. No.: 17/839,292

(22) Filed: Jun. 13, 2022

(65) Prior Publication Data

US 2023/0402335 A1 Dec. 14, 2023

(51) Int. Cl.
*H10W 76/60* (2026.01)
*H10W 90/00* (2026.01)

(52) U.S. Cl.
CPC .......... *H10W 76/60* (2026.01); *H10W 90/00* (2026.01)

(58) Field of Classification Search
CPC ... H01L 23/10; H01L 25/0657; H01L 23/544; H01L 23/02; H01L 23/562; H01L 23/585; H01L 2223/544; H01L 2223/5446; H01L 2223/5448; H01L 2924/173; H01L 2225/06551; H01L 2225/1047; H10W 76/60; H10W 76/63; H10W 90/723; H10W 90/00; H10W 46/604; H10W 46/301; H10W 46/00; H10W 42/00; H10W 42/121; H10W 42/273; H10W 20/021; H10W 20/0698; H10W 20/43; H10W 20/432; H10W 72/241; H10W 72/248

See application file for complete search history.

(56) References Cited

U.S. PATENT DOCUMENTS

| | | | | |
|---|---|---|---|---|
| 8,421,205 | B2 | 4/2013 | Yang | |
| 8,661,389 | B2 | 2/2014 | Chern et al. | |
| 8,698,205 | B2 | 4/2014 | Tzeng et al. | |
| 8,826,212 | B2 | 9/2014 | Yeh et al. | |
| 8,836,141 | B2 | 9/2014 | Chi et al. | |
| 2008/0017965 | A1* | 1/2008 | Nomura | H10W 42/00 257/E21.598 |
| 2014/0035106 | A1* | 2/2014 | Vu | H01L 25/0655 257/E23.18 |

(Continued)

FOREIGN PATENT DOCUMENTS

| | | |
|---|---|---|
| TW | 201411786 A | 3/2014 |
| TW | 201824462 A | 7/2018 |
| TW | 202139398 A | 10/2021 |

*Primary Examiner* — Julio J Maldonado
*Assistant Examiner* — Paul A Berry
(74) *Attorney, Agent, or Firm* — HAYNES AND BOONE, LLP

(57) ABSTRACT

A first die includes a plurality of first transistors. A first seal ring surrounds the first die in a top view. A second die that a plurality of second transistors. A second seal ring surrounds the second die in the top view. A plurality of conductive elements extends into both the first die and the second die in the top view. The conductive elements electrically interconnect the first die with the second die. A third seal ring surrounds, in the top view, the first die, the second die, and the conductive elements.

20 Claims, 20 Drawing Sheets

(56) References Cited

U.S. PATENT DOCUMENTS

| | | | |
|---|---|---|---|
| 2014/0215420 | A1 | 7/2014 | Lin et al. |
| 2014/0264924 | A1 | 9/2014 | Yu et al. |
| 2014/0282289 | A1 | 9/2014 | Hsu et al. |
| 2014/0325466 | A1 | 10/2014 | Ke et al. |
| 2018/0122754 | A1* | 5/2018 | Tatour .................. H10W 42/00 |
| 2021/0217702 | A1* | 7/2021 | Dabral .................. H10P 74/273 |
| 2021/0320040 | A1* | 10/2021 | Fu ....................... H01L 25/0655 |
| 2021/0358821 | A1 | 11/2021 | Chen |

* cited by examiner

FORMING STRUCTURES IN EMPTY REGIONS ON WAFERS WITH DUAL SEAL RING STRUCTURES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

However, despite the advances made in semiconductor fabrication, existing fabrication systems and methods may still have shortcomings. For example, on a wafer level, existing fabrication methods may still leave too much wasted space between the dies. If the wasted space between the dies is sufficiently utilized, it could provide additional functionalities to the fabricated dies, or enhance the versatility thereof.

Therefore, although conventional methods of fabricating semiconductor devices have generally been adequate, they have not been satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figures 1A, 1B:
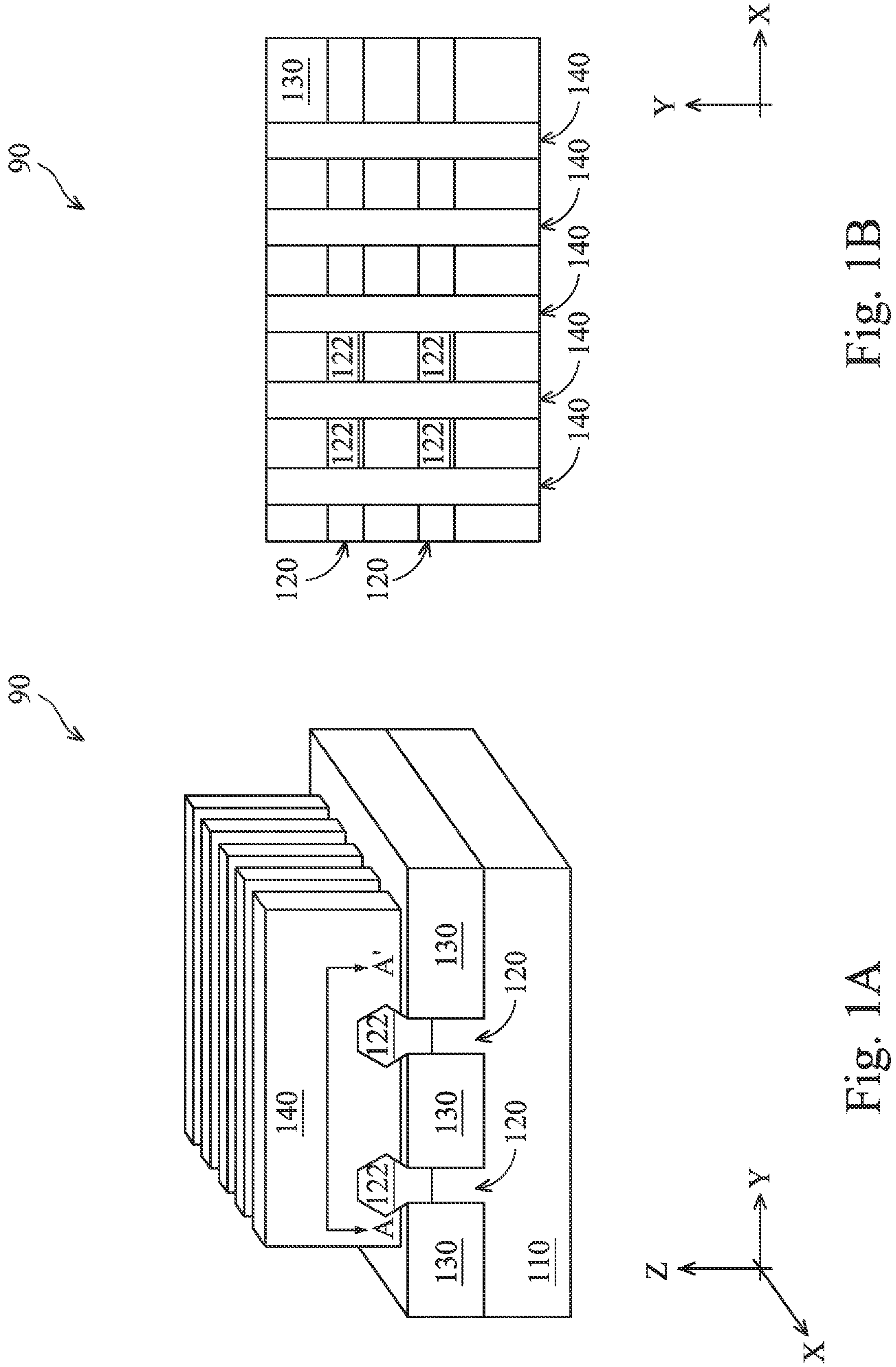
FIG. 1A is a perspective view of an IC device in the form of a FinFET according to various aspects of the present disclosure.
FIG. 1B is a planar top view of an IC device in the form of a FinFET according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc., as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure is generally related to semiconductor devices, and more particularly to IC dies that contain semiconductor devices, including field-effect transistors (FETs), planar FETs, three-dimensional fin-line FETs (FinFETs), or gate-all-around (GAA) devices. One aspect of the present disclosure involves forming wafer-level structures that include connected IC dies and seal rings that surround the IC dies, and forming IC-related structure to utilize what would otherwise be empty (or wasted) space on the wafer. As a result, chip area utilization may be improved, as discussed below in more detail.

FIGS. 1A and 1B illustrate a three-dimensional perspective view and a top view, respectively, of a portion of an Integrated Circuit (IC) device 90. The IC device 90 may be an intermediate device fabricated during processing of an IC die, or a portion thereof, that may comprise static random-access memory (SRAM) and/or other logic circuits, passive components such as resistors, capacitors, and inductors, and active components such as p-type FETs (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. The present disclosure is not limited to any particular number of devices or device regions, or to any particular device configurations, unless otherwise claimed.

For example, although the IC device 90 as illustrated is a three-dimensional FinFET device, the concepts of the present disclosure may also apply to planar FET devices or GAA devices.

Referring to FIG. 1A, the IC device 90 includes a substrate 110. The substrate 110 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 110 may be a single-layer material having a uniform composition. Alternatively, the substrate 110 may include multiple material layers having similar or different compositions suitable for IC device manufacturing. In one example, the substrate 110 may be a silicon-on-insulator (SOI) substrate having a semiconductor silicon layer formed on a silicon oxide layer. In another example, the substrate 110 may include a conductive layer, a semiconductor layer, a dielectric layer, other layers, or combinations thereof. Various doped regions, such as source/drain regions, may be formed in or on the substrate 110. The doped regions may be doped with n-type dopants, such as phosphorus or arsenic, and/or p-type dopants, such as boron, depending on design requirements. The doped regions may be formed directly on the substrate 110, in a p-well structure, in an n-well structure, in a dual-well structure, or using a raised structure. Doped regions may be formed by implantation of dopant atoms, in-situ doped epitaxial growth, and/or other suitable techniques.

Three-dimensional active regions 120 are formed on the substrate 110. The active regions 120 are elongated fin-like structures that protrude upwardly out of the substrate 110. As such, the active regions 120 may be interchangeably referred to as fin structures 120 or fins 120 hereinafter. The fin structures 120 may be fabricated using suitable processes including photolithography and etch processes. The photolithography process may include forming a photoresist layer overlying the substrate 110, exposing the photoresist to a pattern, performing post-exposure bake processes, and developing the photoresist to form a masking element (not shown) including the resist. The masking element is then used for etching recesses into the substrate 110, leaving the fin structures 120 on the substrate 110. The etching process may include dry etching, wet etching, reactive ion etching (RIE), and/or other suitable processes. In some embodiments, the fin structure 120 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. As an example, a layer may be formed over a substrate and patterned using a photolithography process. Spacers are formed alongside the patterned layer using a self-aligned process. The layer is then removed, and the remaining spacers, or mandrels, may then be used to pattern the fin structures 120.

The IC device 90 also includes source/drain features 122 formed over the fin structures 120. The source/drain features 122 may include epi-layers that are epitaxially grown on the fin structures 120. The IC device 90 further includes isolation structures 130 formed over the substrate 110. The isolation structures 130 electrically separate various components of the IC device 90. The isolation structures 130 may include silicon oxide, silicon nitride, silicon oxynitride, fluoride-doped silicate glass (FSG), a low-k dielectric material, and/or other suitable materials. In some embodiments, the isolation structures 130 may include shallow trench isolation (STI) features. In one embodiment, the isolation structures 130 are formed by etching trenches in the substrate 110 during the formation of the fin structures 120. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 130. Alternatively, the isolation structures 130 may include a multi-layer structure, for example, having one or more thermal oxide liner layers.

The IC device 90 also includes gate structures 140 formed over and engaging the fin structures 120 on three sides in a channel region of each fin 120. The gate structures 140 may be dummy gate structures (e.g., containing an oxide gate dielectric and a polysilicon gate electrode), or they may be HKMG structures that contain a high-k gate dielectric and a metal gate electrode, where the HKMG structures are formed by replacing the dummy gate structures. In some embodiments, the HKMG structures may each include a high-k gate dielectric and a metal gate electrode. Example materials of the high-k gate dielectric include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or combinations thereof. The metal gate electrode may include one or more work function metal layers and one or more fill metal layers. The work function metal layers may be configured to tune a work function of the respective transistor. Example materials for the work function metal layers may include titanium nitride (TiN), Titanium aluminide (TiAl), tantalum nitride (TaN), titanium carbide (Tic), tantalum carbide (TaC), tungsten carbide (WC), titanium aluminum nitride (TiAlN), zirconium aluminide (ZrAl), tungsten aluminide (WAl), tantalum aluminide (TaAl), hafnium aluminide (HfAl), or combinations thereof. The fill metal layer may serve as a main conductive portion of the gate electrode layer. Though not depicted herein, the gate structure 140 may include additional material layers, such as an interfacial layer over the fin structures 120, a capping layer, other suitable layers, or combinations thereof.

Referring to FIG. 1B, multiple fin structures 120 are oriented lengthwise along the X-direction, and multiple gate structure 140 are oriented lengthwise along the Y-direction, i.e., generally perpendicular to the fin structures 120. In many embodiments, the IC device 90 includes additional features such as gate spacers disposed along sidewalls of the gate structures 140, hard mask layer(s) disposed over the gate structures 140, and numerous other features.

Figure 1C:
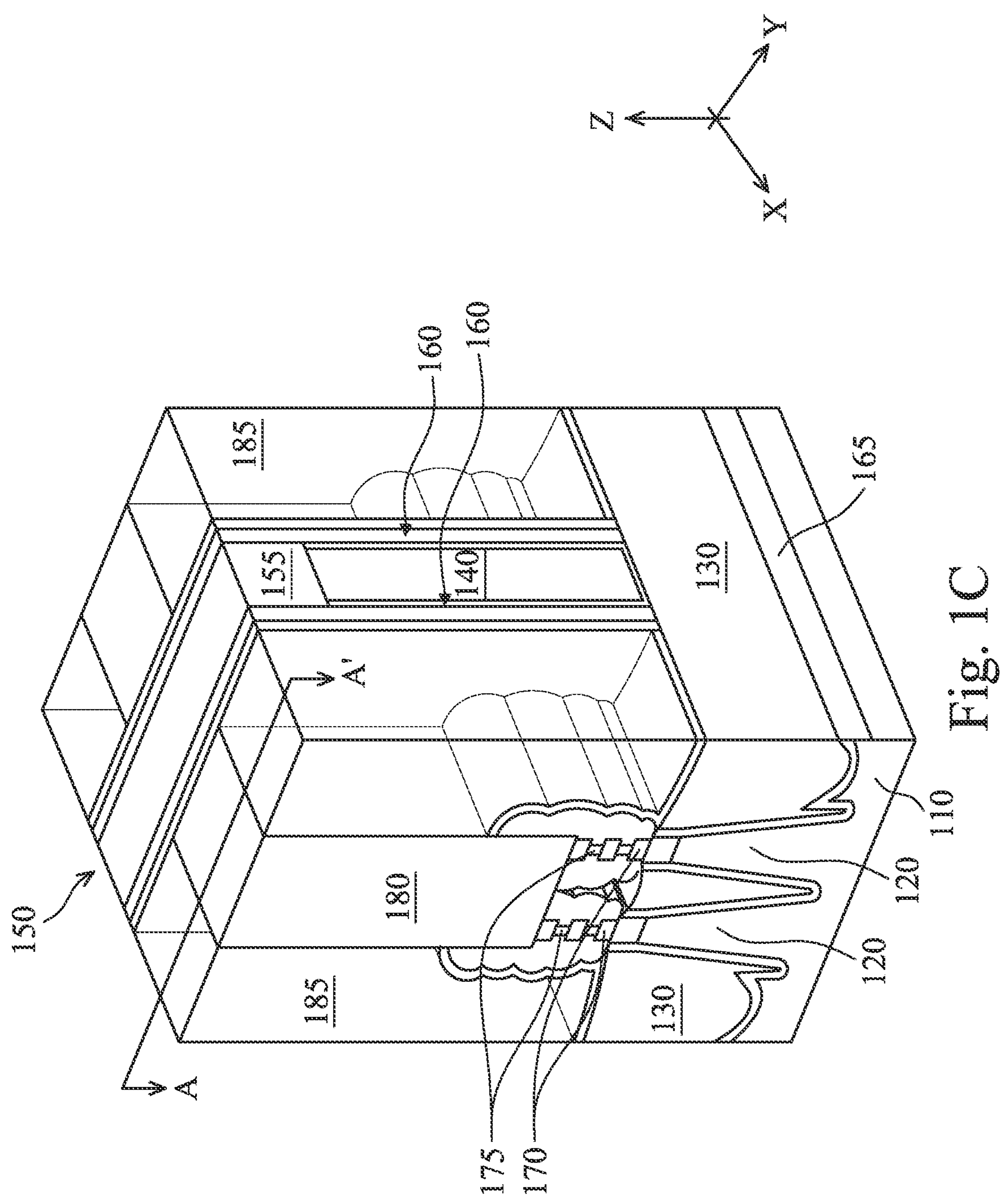
FIG. 1C is a perspective view of an IC device in the form of a GAA device according to various aspects of the present disclosure.

It is also understood that the various aspects of the present disclosure discussed below may apply to multi-channel devices such as Gate-All-Around (GAA) devices. FIG. 1C illustrates a three-dimensional perspective view of an example GAA device 150. For reasons of consistency and clarity, similar components in FIG. 1C and FIGS. 1A-1B will be labeled the same. For example, active regions such as fin structures 120 rise vertically upwards out of the substrate 110 in the Z-direction. The isolation structures 130 provide electrical separation between the fin structures 120. The gate structure 140 is located over the fin structures 120 and over the isolation structures 130. A mask 155 is located over the gate structure 140, and gate spacers 160 are located on sidewalls of the gate structure 140. A capping layer 165 is formed over the fin structures 120 to protect the fin structures 120 from oxidation during the forming of the isolation structures 130.

A plurality of nano-structures 170 are disposed over each of the fin structures 120. The nano-structures 170 may include nano-sheets, nano-tubes, or nano-wires, or some other type of nano-structure that extends horizontally in the X-direction. Portions of the nano-structures 170 under the gate structure 140 may serve as the channels of the GAA device 150. Dielectric inner spacers 175 may be disposed between the nano-structures 170. In addition, although not illustrated for reasons of simplicity, each of the nano-structures 170 may be wrapped around circumferentially by a gate dielectric as well as a gate electrode. In the illustrated embodiment, the portions of the nano-structures 170 outside the gate structure 140 may serve as the source/drain features of the GAA device 150. However, in some embodiments, continuous source/drain features may be epitaxially grown over portions of the fin structures 120 outside of the gate structure 140. Regardless, conductive source/drain contacts 180 may be formed over the source/drain features to provide electrical connectivity thereto. An interlayer dielectric (ILD) 185 is formed over the isolation structures 130 and around the gate structure 140 and the source/drain contacts 180.

Figure 2:
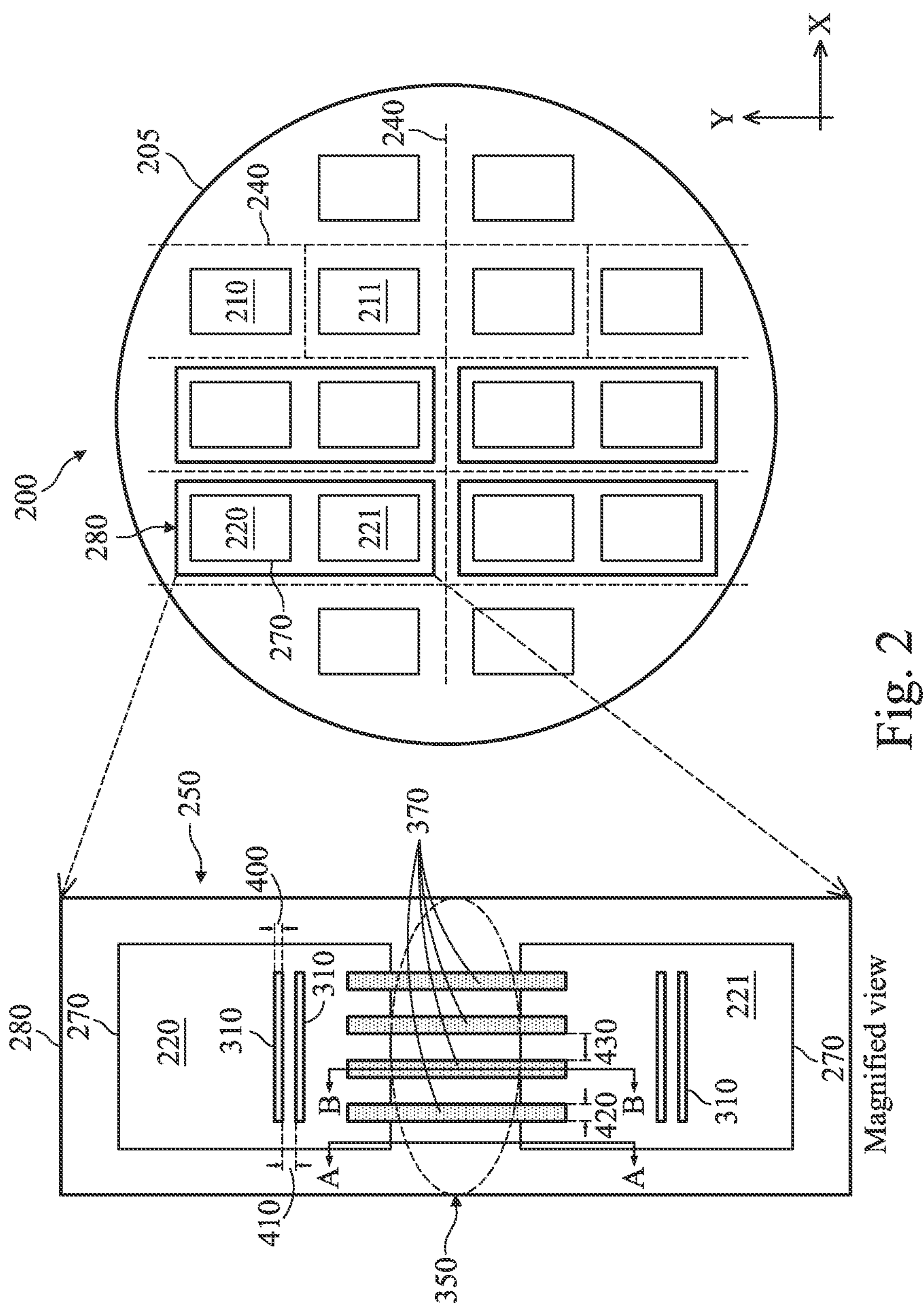
FIG. 2 illustrates a top view of a wafer-level structure according to various aspects of the present disclosure.

FIG. 2 illustrates a top view of a wafer-level structure 200, as well as a magnified view of a portion of the wafer-level structure 200. The top view is taken along a horizontal plane defined by the X-axis (or X-direction) and the Y-axis (or Y-direction). The wafer-level structure 200 may be a semiconductor wafer 205 or a portion thereof. As shown in the simplified example of FIG. 2, the wafer-level structure 200 may include a plurality of IC dies, such as IC devices 210, 211, 220, and 221. Each of these IC dies 210-211 and 220-221 contains a plurality of IC devices, such as the IC device 90 or the GAA device 150 discussed above, or other types of transistors, or other forms of active and/or passive IC microelectronic components (e.g., vias and metal lines). In some embodiments, the IC dies 210-211 and 220-221 have identical IC designs and layouts. In other words, they are implemented to be identical devices. For example, the IC dies 210-211 and 220-221 may each be implemented as a computer processor, or a core thereof. In other embodiments, the IC dies 210-211 and 220-221 may each be implemented as an electronic memory storage device, such as a Static Random Access Memory (SRAM) or Dynamic Random-Access Memory (DRAM), or a portion thereof.

Some of these IC dies, such as IC dies 210-211, are each implemented as a standalone IC die. In other words, the IC die 210 and the IC die 211 may function independently from one another, and no electrical connections are made on the wafer-level structure 200 to connect them together. After the fabrication of these standalone IC dies 210 and 211 is completed, the wafer-level structure 200 may be diced along a plurality of scribe lines 240 (which extend along both the X-axis and the Y-axis, as shown in FIG. 2) to separate the standalone IC dies 210-211 from one another. This is referred to as a singulation process. Each of the standalone IC dies 210-211 may then be packaged to form an IC chip.

Meanwhile, some of the IC dies, such as the IC dies 220-221, are electrically interconnected to form interconnected IC dies, such as interconnected IC die 250. Unlike the standalone IC dies 210-211 where the dicing occurs around all four rectangular boundaries of each of the standalone IC die, the dicing for the interconnected IC die 250 occurs around the collective boundaries of the interconnected IC die 250, which may or may not be rectangular (though they are rectangular in the embodiment illustrated in FIG. 2). For example, there is no scribe line between the IC die 220 and the IC die 221, and thus no dicing will take place between the IC die 220 and 221. The details of the interconnected IC die 250 are illustrated in the magnified view portion of FIG. 2.

The interconnected IC die 250 offers enhanced performance or functionality compared to the standalone IC dies 210-211. For example, in embodiments where the standalone IC dies 210-211 each corresponds to a single-core computer processor, the interconnected IC die 250 corresponds to a dual-core computer processor, which may offer twice the speed or processing/computing power of the single-core computer processor. Similarly, in embodiments where the standalone IC dies 210-211 each corresponds to a computer memory storage (e.g., SRAM or DRAM), the interconnected IC die 250 corresponds to a computer memory storage having double the memory capacity of the standalone IC dies. Since the interconnected IC dies (such as the interconnected IC die 250) may be implemented merely by interconnecting any number of desired otherwise-standalone IC dies together, the functionality and/or performance of the interconnected IC dies may be flexibly configured, for example, based on customer demand or design/fabrication requirements. In many real world scenarios, this may be more preferable than having to separately design and fabricate an IC chip (as a standalone IC die) having comparable performance or functionality as the interconnected IC die 250, since doing so will require additional design and/or fabrication resources (e.g., requiring another set of lithography masks).

According to various aspects of the present disclosure, dual seal ring structures are implemented to protect the interconnected IC dies. In more detail, a seal ring 270 is implemented to circumferentially surround the four sides of each of the IC dies 210-211 and 220-221 in the top view, and another seal ring 280 is implemented to circumferentially surround the interconnected IC die 250 in the top view. Therefore, the seal ring 280 also circumferentially surrounds the seal rings 270 of the IC dies 220 and 221 collectively. The seal rings 270 and 280 are each shaped as a rectangle in the embodiment shown in FIG. 2, but it is understood that they may be shaped differently in alternative embodiments.

Figure 3:
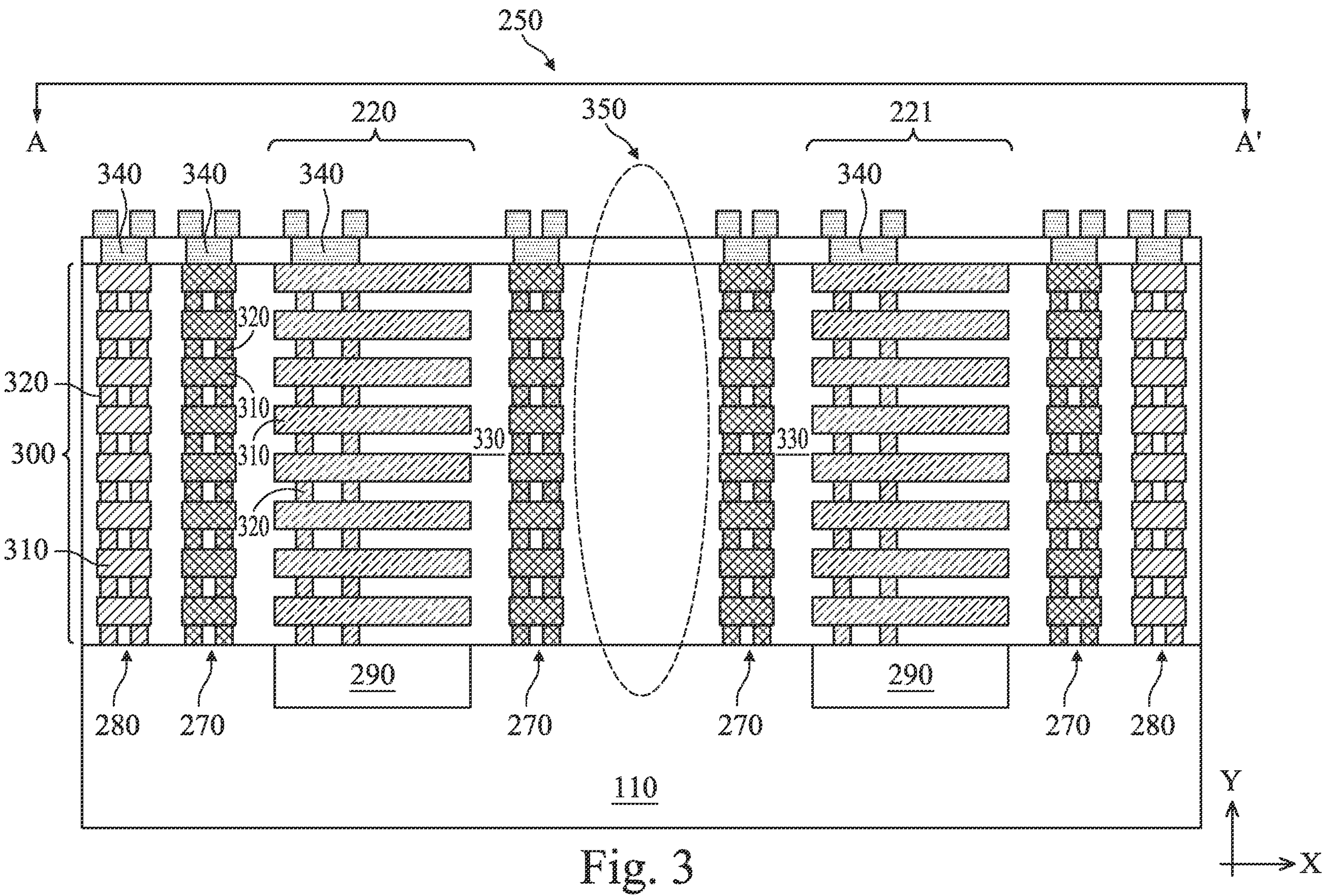
FIGS. 3-4 are cross-sectional side views of an IC device according to various aspects of the present disclosure.

FIG. 3 illustrates additional details of the seal rings 270 and 280. In that regard, FIG. 3 is a cross-sectional side view of a portion of the wafer-level structure 200 taken along a cutline A-A'. Since the cutline A-A' extends in the Y-direction, the cross-sectional side view of FIG. 3 is a Y-Z plane cross-sectional view.

The wafer-level structure 200 includes the substrate 110 discussed above, on which a plurality of semiconductor devices 290 (e.g., including the FinFET transistors or GAA transistors discussed above) are formed. These semiconductor devices 290 may also be referred to as an active layer, or alternatively, the formation of the transistors of the semiconductor devices 290 are formed in an active layer. The wafer-level structure 200 further includes a multi-layer interconnect structure 300 that is formed over, and electrically coupled to, the semiconductor devices 290. The multi-layer interconnect structure 300 includes a plurality of metal layers (e.g., Metal-0, Metal-1, . . . , Metal-N) that each include a plurality of conductive interconnecting elements such as metal lines 310. The metal lines 310 from different metal layers are vertically interconnected together by conductive vias or contacts, such as vias 320. The metal lines 310 and vias 320 are embedded in, or surrounded by an electrically insulating material, such as an interlayer dielectric (ILD) 330. A plurality of conductive pads (e.g., containing aluminum or copper, or combinations thereof) 340 are also formed over, and are electrically coupled to, the multi-layer interconnect structure 300. The conductive pads 340 may also be considered a part of the multi-layer interconnect structure 300 in some embodiments. In addition to providing electrical connectivity to the multi-layer interconnect structure 300, the conductive pads 340 also prevent the components therebelow from undesirable oxidation. Electrical access to the various components of the semiconductor devices 290 is made possible through the conductive pads 340, the metal lines 310, and the vias 320.

It is understood that FIG. 3 merely illustrates a simplified arrangement of the semiconductor devices 290 and the interconnect structure 300. In other words, the semiconductor devices 290, the metal lines 310, and the vias 320 are merely represented at a conceptual level, and their actual configuration in the IC dies 220-221 are far more complex than what is crudely shown in FIG. 3 (or in subsequent top view or cross-sectional view figures).

The first seal ring layer—the seal rings 270 and the seal ring 280—are comprised of the vertical stacks of metal lines 310 and vias 320 of the multi-layer interconnect structure 300, as well as the conductive pads 340. For example, in the cross-sectional side view of FIG. 3, the seal ring 270 for the IC die 220 includes a vertical stack of metal lines 310, vias 320, and conductive pads 340 on the "left" of the IC die 200, as well as a vertical stack of metal lines 310, vias 320, and conductive pads 340 on the "right" of the IC die 200. Likewise, the IC die 221 also has a seal ring 270 that includes vertical stacks of metal lines 310, vias 320, and conductive pads 340 disposed on their sides. The second seal ring layer—the seal ring 280—is also made up of vertical stacks of metal lines 310, vias 320, and the conductive pads 340. Compared to the seal ring 270, the seal ring 280 is disposed farther away from the IC die 220/221. Stated differently, the seal rings 270 are disposed between their respective IC die 220/221 and the seal ring 280.

The seal rings 270 and 280 protect the IC dies 220 and 221 from undesirable elements in semiconductor fabrication, such as moisture, humidity, contaminant particles, or even pressure exerted against the IC dies 220-221 by a dicing/sawing tool in a singulation process. This is because the seal rings 270 and 280 each forms an enclosed barrier around the IC die 220/221, such that the undesirable elements discussed above cannot penetrate through the barrier to adversely affect the components within the IC die 220/221. The seal rings 270 each offers a first layer of protection for the individual IC dies 220 and 221. The seal ring 280 offers a second layer of protection for the individual IC dies 220 and 221, and for the interconnected IC die 250 as a whole.

Within the interconnected IC die 250, a gap region 350 is located between the different seal rings 270 that surround the IC dies 220 and 221. This gap region 350 exists due to the fact that the interconnected IC die 250 is formed on the same wafer as the standalone IC dies 210-211. In more detail, a similar gap exists between the standalone IC dies 210-211, because the gap corresponds to a scribe line region where the wafer will be singulated to separate the standalone IC dies 210-211. Meanwhile, for ease of fabrication, the IC dies 220-221 of the interconnected IC die 250 are arranged similar to the standalone IC dies 210-211 with respect to their respective sizes and spacings from adjacent IC dies. In this manner, the interconnected IC die 250 "inherits" the gap (corresponding to the scribe line region) between the standalone IC dies 210-211. In contrast to the standalone IC dies 210-211, where the scribe line region will be cut/diced, the gap region 350 will be preserved (since singulation does not occur between the two IC dies 220-221 that are meant to be interconnected together) and will exist on the final structure of the interconnected die 250.

Figure 4:
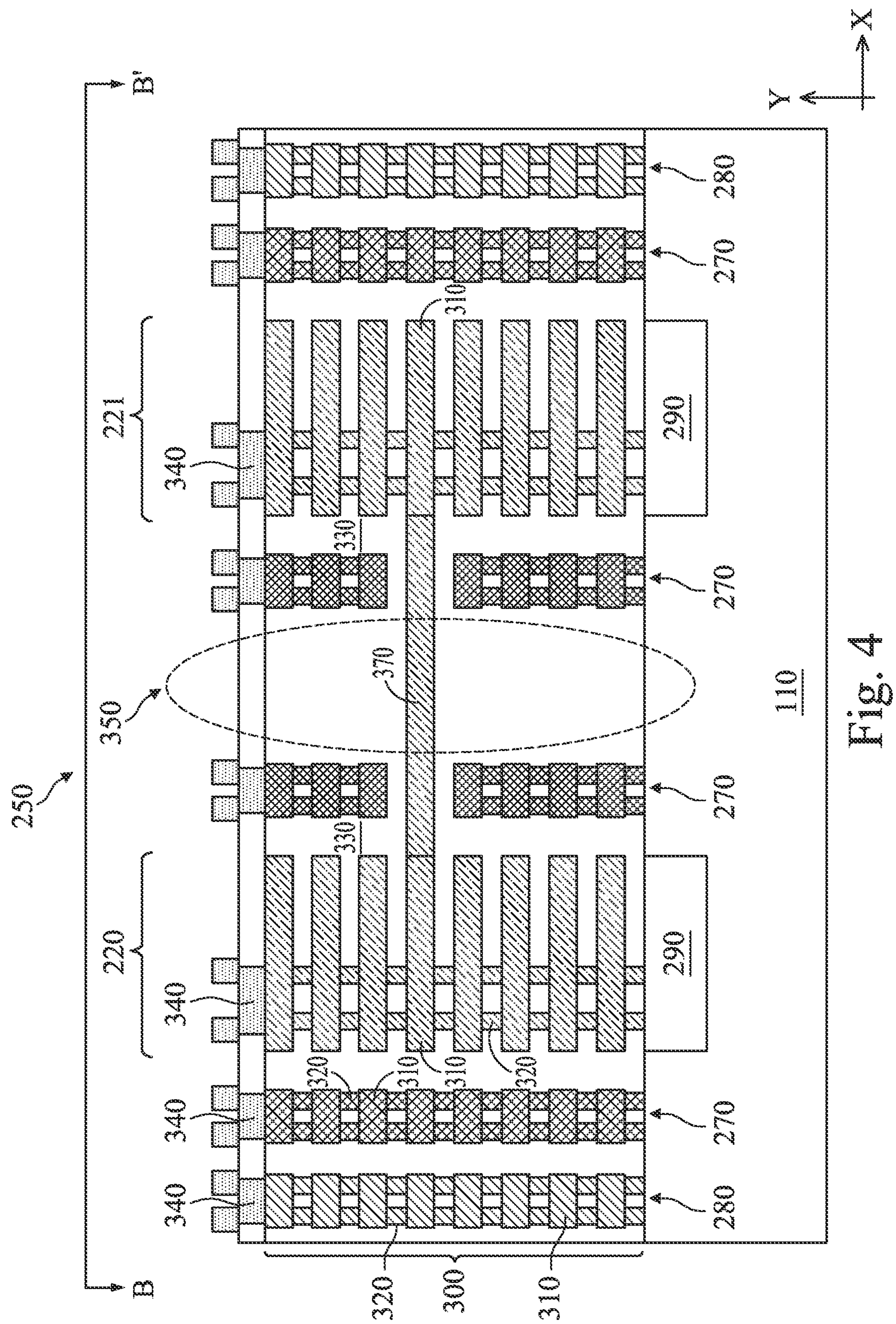

While the gap region 350 does not necessarily degrade electrical performance of the interconnected IC die 250, it may be considered a sub-optimal utilization of valuable chip real estate, especially as the IC devices are scaled down. To address this issue, the present disclosure forms various useful structures in the gap region 350, such as a plurality of conductive elements 370 (see the magnified view of the interconnected die 250 of FIG. 2). One of the conductive elements 370 is also shown in FIG. 4, which illustrates a cross-sectional side view of another portion of the wafer-level structure 200 taken along a cutline B-B' (shown in FIG. 2), where one of the conductive elements 370 is implemented. The cutline B-B' also extends in the Y-direction, and thus the cross-sectional side view of FIG. 4 is also a Y-Z plane cross-sectional view.

In more detail, the conductive elements 370 (e.g., metal lines containing copper, aluminum, cobalt, or combinations thereof) are implemented to electrically interconnect the IC die 220 and the IC die 221 together. The conductive elements 370 may carry or allow the conduction of power signals (e.g., Vcc or Vdd), and/or carry or allow the conduction of other suitable electrical signals such as control signals (e.g., READ or WRITE signals for an SRAM device).

The conductive elements 370 each extends in the Y-direction and spans across the gap region 350. For example, as shown in FIG. 4, a "leftmost" end of the conductive element 370 is connected to a "rightmost" end of one of the metal lines 310 of the IC die 220, and a "rightmost" end of the conductive element 370 is connected to a "leftmost" end of one of the metal lines 310 of the IC die 221, thereby electrically interconnecting the semiconductor devices 290 of the IC dies 220 and 221 together. As such, the gap region 350 is effectively utilized as an area for establishing electrical interconnections within the interconnected IC die 250, and it no longer is merely a waste of value chip real estate.

Note that in order for the conductive elements 370 to interconnect the IC dies 220 and 221, their respective seal rings 270 have to be broken up or otherwise contain a discontinuity. For example, the vertical stack (of the seal ring 270) located to the "right" of the IC die 220 is broken up by removing (or not implementing) one of the metal lines (e.g., a metal line in a Metal-5 layer) and the vias above and below that metal line. Similarly, the vertical stack (of the seal ring 270) located to the "left" of the IC die 221 is broken up by removing (or not implementing) one of the metal lines (e.g., a metal line in a Metal-5 layer) and the vias above and below that metal line. Such an arrangement prevents the undesirable electrical shorting between the conductive elements 370 and the seal rings 270, which would have increased undesirable electrical parasitics (e.g., parasitic capacitance). It is understood that the discontinuity within the seal rings 270 does not adversely affect the sealing of the interconnected IC die 250 from undesirable external elements, since the components of the IC die 250 (including the conductive elements 370) are still circumferentially surrounded and protected by the seal ring 280, which is still intact.

Referring back to the top view of FIG. 2, the conductive elements 370 may have different sizing and spacing requirements compared to the rest of the metal lines 310 of the IC dies 220-221. For example, the IC design and/or layout rules may specify that the metal lines 310 of the IC dies 220-221 can have a width 400 (in either the X-direction or in the Y-direction), as well as a spacing 410 between the adjacently disposed metal lines 310. In that regard, the width 400 and spacing 410 are both measured in the direction that is perpendicular to the direction in which the metal lines 310 extend. In other words, if a metal line 310 extends in the X-direction, then its width is measured as the dimension of the metal line 310 in the Y-direction, and the spacing between the metal line 310 and its nearest metal line is also measured in the Y-direction, and vice versa.

As shown in FIG. 2, the conductive elements 370 each have a width 420 that exceeds the width 400 of the metal lines 310, regardless of whether the widths 400 and 420 are measured in the same direction. Moreover, each conductive element 370 is spaced apart from an adjacent conductive element 370 by a spacing 430 that exceeds the spacing 410 separating the adjacent metal lines 310, regardless of whether the spacings 410 and 430 are measured in the same direction. The conductive elements 370 are configured to have larger widths and spacings at least in part because of pattern or topography uniformity concerns. In more detail, as semiconductor feature sizes continue to get scaled down, is may be undesirable for the semiconductor wafer to have relatively large chunks of empty space, because that could lead to subpar processing of the semiconductor devices. Instead, it is more preferable to achieve relative feature pattern uniformity on the wafer, for example, by ensuring that there are no large empty areas on the wafer. Having a greater pattern uniformity on a wafer also helps to reduce an undesirable loading effect in semiconductor fabrication.

Here, the gap region 350 would have otherwise been considered a large empty region, had the conductive elements 370 not been implemented. However, the electrical interconnection between the IC dies 220-221 may not require a great number of individual conductive elements. As such, if the conductive elements 370 were to be implemented with the same width 400 as the rest of the metal line 310, then the collective areas of the conductive elements 370 may still not be as large as desirable to achieve better pattern uniformity with the rest of the IC dies 220-221. Thus, the present disclosure scales up the widths 420 of the conductive elements 370 to improve the pattern uniformity. The spacing 430 between the conductive elements 370 is also greater than the spacing 410 between the metal lines 310, so that there is less risk of electrical bridging (e.g., unintentional electrical shorting between IC components) occurring in the gap region 350. In other words, the spacing 410 between the metal lines 310 cannot be made too big, because doing so will limit the number of metal lines that can be implemented in each metal layer. In comparison, the number of conductive elements 370 needed to electrically connect the IC dies 220-221 together may not be as great, and thus a larger spacing 430 between adjacent pairs of conductive elements 370 is tolerated.

In some embodiments, a ratio of the width 420 and the width 400 is greater than 1:1 and is in a range between about 2:1 and about 4:1, and a ratio of the spacing 430 and the spacing 410 is greater than 1:1 and is in a range between about 2:1 and about 4:1. It is understood that the above ranges are not randomly chosen but specifically configured to maximize the likelihood of achieving relative pattern or topography uniformity and to reduce the chances of electrical bridging.

Note that for reasons of simplicity, FIG. 2 does not specifically illustrate the electrical and/or physical connections between the conductive elements 370 and their corresponding metal lines 310 of the IC dies 220-221, but it is understood that such connections exist to ensure that the relevant electrical circuitry of the IC die 220 is electrically coupled to the relevant electrical circuitry of the IC die 221.

Figure 5:
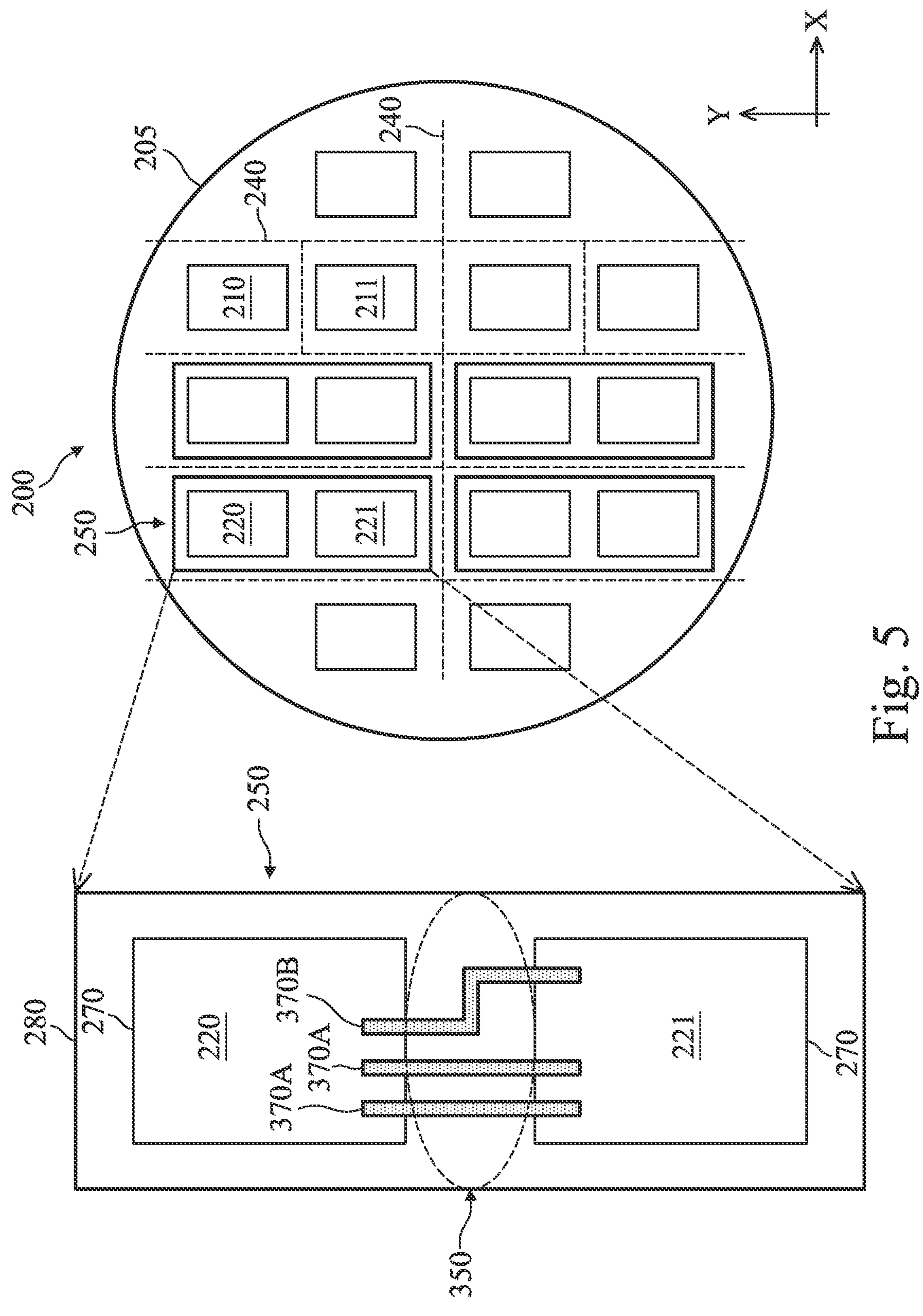
FIGS. 5-11 illustrate top views of a wafer-level structure according to various aspects of the present disclosure.

FIG. 5 illustrates a top view of another embodiment of the wafer-level structure 200, including the magnified top view of the interconnected IC die 250. For reasons of clarity and consistency, similar components appearing in FIGS. 2 and 5 will be labeled the same. Similar to the embodiment of FIG. 2, the interconnected IC die 250 shown in the embodiment of FIG. 5 also utilizes a plurality of conductive elements 370A-370B to electrically couple the IC dies 220 and 221 together. The conductive elements 370A-370B are similar to the conductive elements 370 discussed above, as they are electrically conductive and are electrically connected to the metal lines (not specifically shown herein for reasons of simplicity) of the IC dies 220-221. The conductive elements 370A-370B also extend or span across the gap region 350, which is an effective utilization of what would otherwise be considered wasted chip space. In addition, the implementation of the conductive elements 370A-370B helps to improve semiconductor fabrication itself, for example, by improving pattern uniformity and reducing a loading effect. The conductive elements 370A-370B may also be sized similarly to the conductive elements 370 discussed above, for example, in terms of their respective widths and spacings.

One difference between the conductive elements 370A-370B and the conductive elements 370 discussed above is that not all of the conductive elements 370A-370B are straight. For example, at least one of the conductive elements 370B includes one or more angular (e.g., 90 degree) turns. As shown in FIG. 5, the conductive element 370B starts out by extending from the IC die 220 toward the IC die 221 in the Y-direction. The conductive element 370B then makes a substantially 90 degree turn in the gap region 350 and therefore extends in the X-direction. The conductive element 370B then makes another substantially 90 degree turn in the gap region 350 and therefore extends in the Y-direction again towards the IC die 221. The reasons for the non-straight top view profile of the conductive element 370B may be to facilitate electrical routing (e.g., bypass or avoid certain microelectronic components), or it may be for pattern uniformity or loading purposes. It is understood that other shapes or top view configurations may be implemented for the conductive elements 370A-370B as well, though they are not specifically illustrated herein for reasons of simplicity.

Figure 6:
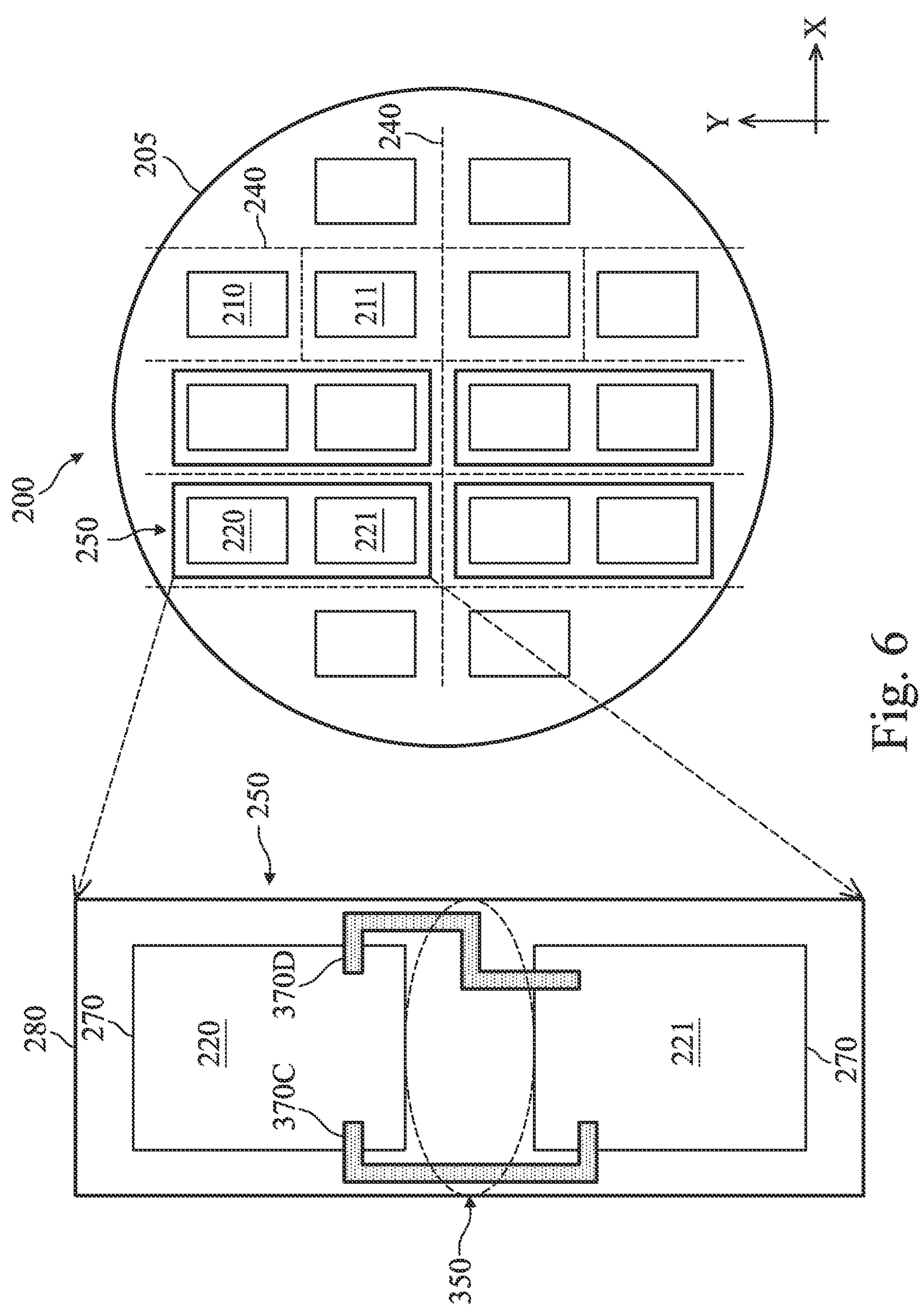

FIG. 6 illustrates a top view of yet another embodiment of the wafer-level structure 200, including the magnified top view of the interconnected IC die 250. Again, similar components appearing in FIGS. 2 and 5-6 are labeled the same for reasons of clarity and consistency. Similar to the embodiments of FIGS. 2 and 5, the interconnected IC die 250 shown in the embodiment of FIG. 6 also utilizes a plurality of conductive elements 370C-370D to electrically couple the IC dies 220 and 221 together. However, at least some portions of the conductive elements 370C-370D are implemented between the seal rings 270 and 280 in the X-direction. Stated differently, the seal rings 270 and 280 each have segments that extend in the Y-direction, and at least some portions of the conductive elements 370C-370D are disposed between these Y-direction-extending segments of the seal rings 270 and 280. For example, the conductive element 370C extends out of the IC die 220 in the X-direction, then makes a substantially 90 degree turn to extend in the Y-direction, and then makes another substantially 90 degree turn to extend into the IC die 221 in the X-direction. Meanwhile, the conductive element 370D extends out of the IC die 220 in the X-direction, then makes a substantially 90 degree turn to extend in the Y-direction, and then makes another substantially 90 degree turn to extend into the gap region 350 in the X-direction, and finally makes another substantially 90 degree turn to extend into the IC die 221 in the Y-direction.

Figure 7:
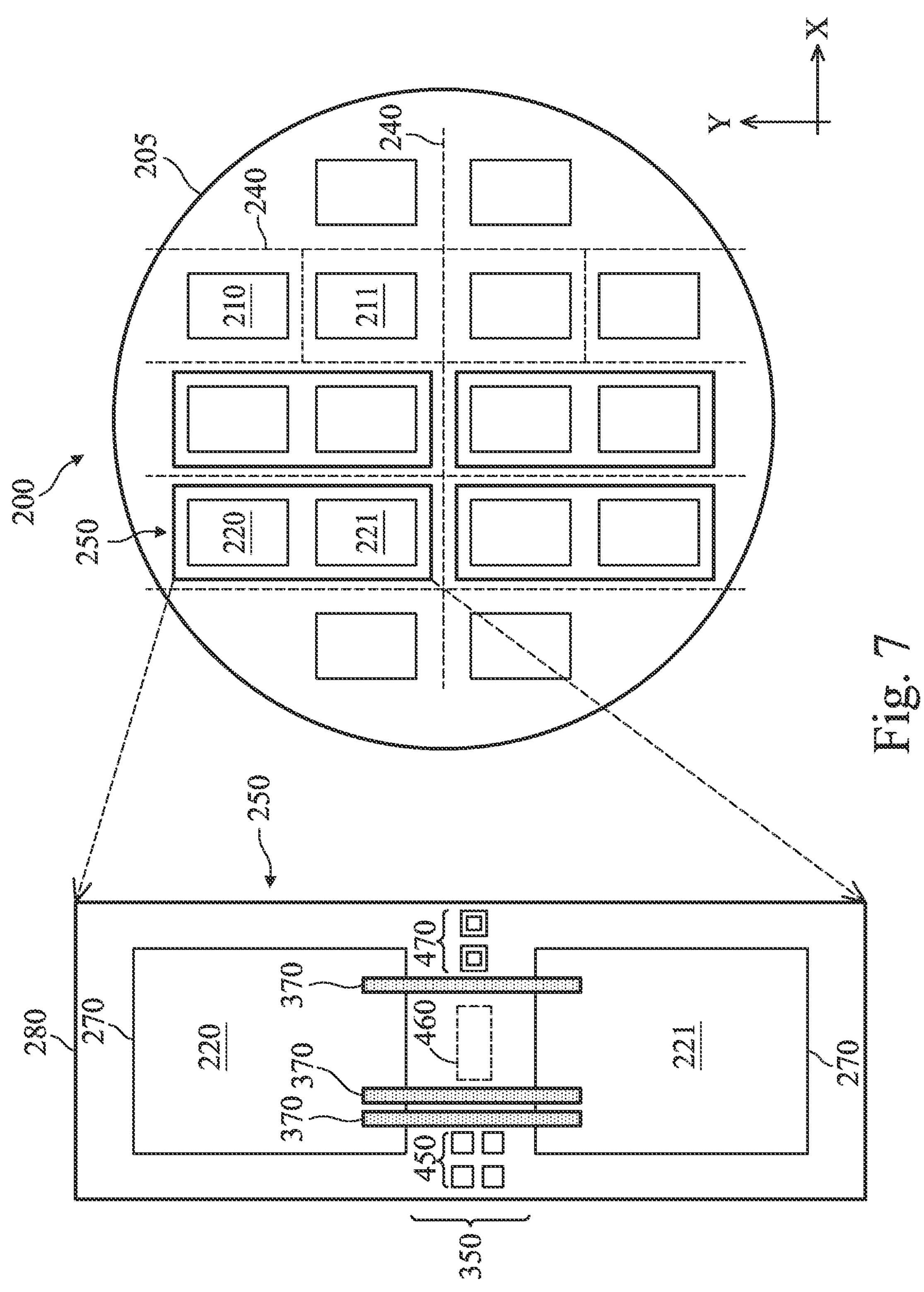

FIG. 7 illustrates a top view of a further embodiment of the wafer-level structure 200, including the magnified top view of the interconnected IC die 250. Again, similar components appearing in FIGS. 2 and 5-7 are labeled the same for reasons of clarity and consistency. In addition to implementing the conductive elements 370 in the gap region 350 to electrically couple the IC dies 220 and 221 together, the embodiment of FIG. 7 implements a plurality of other structures in the gap region 350 to more effectively utilize this valuable chip area.

For example, the embodiment of FIG. 7 may implement a plurality of dummy structures 450 in the gap region 350. The dummy structures 450 may include a dielectric material or a metal material. For example, the dummy structures 450 may include dummy fin structures, dummy gate structures, dummy metal lines, dummy vias, etc. Although the dummy structures 450 do not function as microelectronic components of the IC dies 220-221, they are implemented herein to improve the pattern uniformity or to reduce loading, for example, by increasing the pattern density of the gap region 350 so that it is not so empty). Accordingly, the fabrication of the wafer-level structure 200 may be improved by the presence of the dummy structures 450.

As another example, the embodiment of FIG. 7 may implement one or more test structures 460. Each of the testing structures 460 may be designed and configured for the electrical testing of a semiconductor circuit element or component, such as a transistor or a resistor. Thus, the test structures 460 may each contain one of the semiconductor elements or components, as well as conductive pads for establishing electrical connections between the terminals of the test structures 460 and external devices. Electrical currents or voltages may be applied to the test structures 460.

As yet another example, the embodiment of FIG. 7 may implement one or more patterns 470. The patterns 470 are patterns formed on the wafer to monitor the status of the wafer as it undergoes one or more fabrication processes, and/or the efficacy or precision of the one or more fabrication processes. In some embodiments, the patterns 470 may include process monitor patterns to measure the efficacy of a particular fabrication process. In other embodiments, the patterns 470 may include alignment marks and/or overlay marks, which may be features that are used for system calibration and/or for aligning subsequently-formed patterns to previously-formed patterns, for example, patterns in a different layer. In various embodiments, the patterns 470 may include dielectric features or metal features.

It is understood that the dummy structures 450, the test structures 460, and the patterns 470 may each be implemented in more than just a top layer of the wafer-level structure 200. For example, the dummy structures 450, the test structures 460, and the patterns 470 may be implemented (e.g., as metal lines and/or vias) in any one of the metal layers of the multi-layer interconnect structure 300 discussed above. The dummy structures 450, the test structures 460, and the patterns 470 may also be implemented in the layers below the multi-layer interconnect structure 300, for example, as components in the substrate 110.

Regardless of what type of structures are implemented in the gap region 350, the fact that they are implemented in the gap region 350 means that valuable chip real estate within the IC dies 220-221 is saved or preserved. In other words, whereas conventional fabrication may have to form structures (e.g., the dummy structures 450, the test structures 460, or the monitor patterns 470) within the IC dies 220-221—which would consume precious chip area—the present disclosure frees up that precious chip area by forming the structures 450-470 outside the IC dies 220-221 and in the otherwise-wasted gap region 350 instead. As such, IC fabrication efficiency may be increased, and fabrication costs may be reduced.

Figure 8:
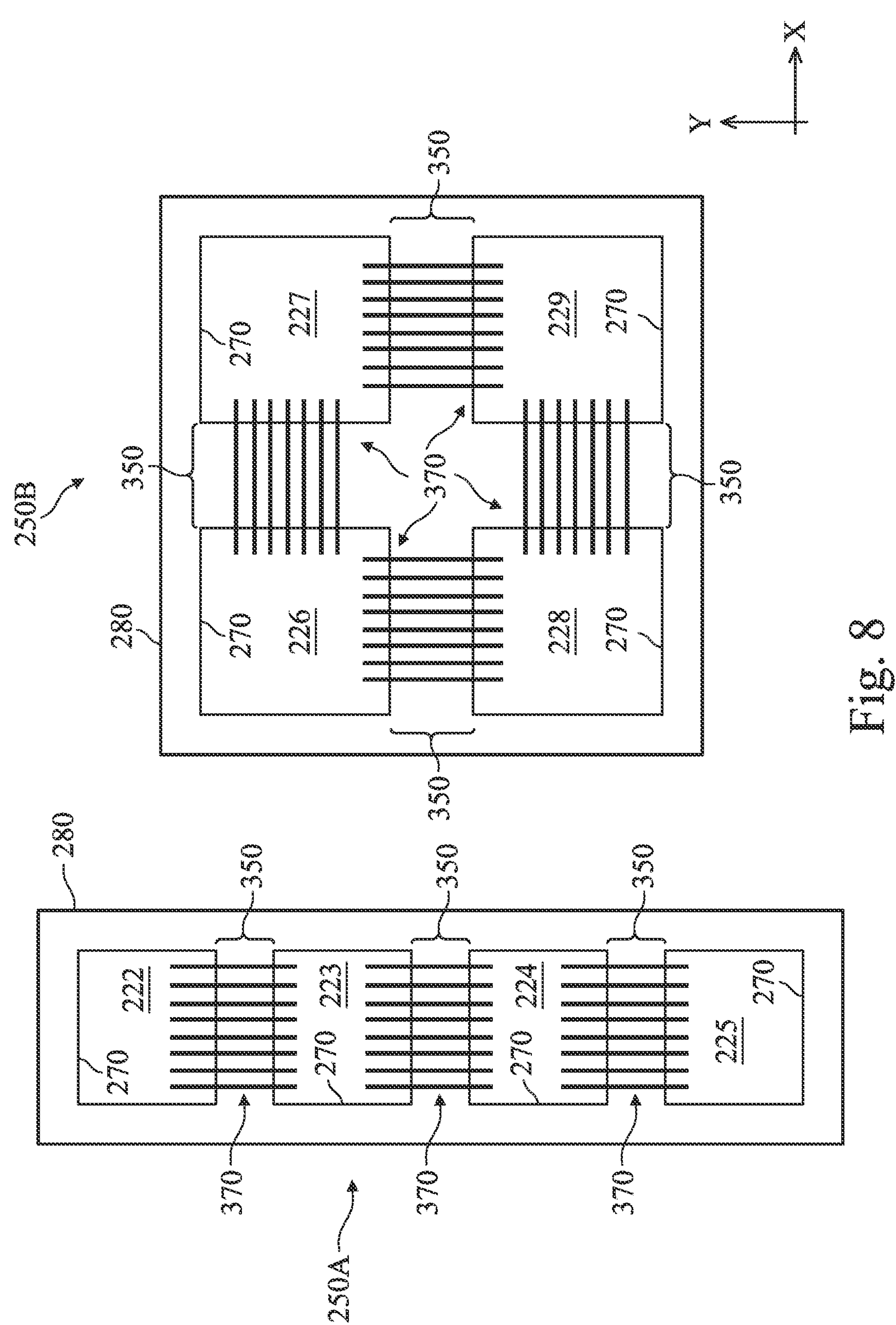

FIG. 8 illustrates top views of other embodiments of interconnected IC dies 250A and 250B. Whereas the interconnected IC die 250 discussed above include two IC dies 220-221 that are electrically interconnected together and circumferentially surrounded in 360 degrees by the seal ring 280 (as an outer seal ring layer), the interconnected IC dies 250A and 250B each include more than two IC dies. For example, the interconnected IC die 250A includes four individual IC dies 222, 223, 224, and 225 that are electrically interconnected together. In the illustrated embodiment, the IC dies 222-225 may be arranged in a column that extends in the Y-direction. The IC dies 222-223 are electrically interconnected together by one group of conductive elements 370. The IC dies 223-224 are electrically interconnected together by another group of conductive elements 370. The IC dies 224-225 are electrically interconnected together by a further group of conductive elements 370. Each of the IC dies 222-225 is surrounded circumferentially in 360 degrees by a respective seal ring 270 (as an inner seal ring layer). The four IC dies 222-225 are then collectively surrounded circumferentially in 360 degrees by the seal ring 280 (as an outer seal ring layer). The structures 450-470 discussed above with reference to FIG. 7 may be implemented in the gap regions 350 between the IC dies 222-223, 223-224, and 224-225.

As another example, the interconnected IC die 250B includes four individual IC dies 226, 227, 228, and 229 that are electrically interconnected together. In the illustrated embodiment, the IC dies 226-229 may be arranged in a two-by-two matrix (e.g., having two rows and two columns). The IC die 226 is electrically interconnected to the IC die 227 in the X-direction and to the IC die 228 in the Y-direction. The IC die 227 is electrically interconnected to the IC die 226 in the X-direction and to the IC die 229 in the Y-direction. The IC die 228 is electrically interconnected to the IC die 229 in the X-direction and to the IC die 226 in the Y-direction. The IC die 229 is electrically interconnected to the IC die 228 in the X-direction and to the IC die 227 in the Y-direction. Again, the electrical connections are done using different subsets of the conductive elements 370. Each of the IC dies 226-229 is surrounded circumferentially in 360 degrees by a respective seal ring 270 (as an inner seal ring layer). The four IC dies 226-229 are then collectively surrounded circumferentially in 360 degrees by the seal ring 280 (as an outer seal ring layer). The structures discussed above with reference to FIG. 7 may be implemented in the gap regions 350 between the IC dies 226-227, 227-228, 228-229, and 226-228.

Other embodiments of the interconnected IC die are envisioned but not specifically illustrated herein for reasons of simplicity. For example, an interconnected IC die may include a row of interconnected IC dies that extend in the X-direction. As another example, an interconnected IC die may include fewer or more than four dies (e.g., three or five). In addition, the individual IC dies of an interconnected IC die need not be substantially identical to another. In other words, the interconnected IC die may include IC dies that are different types of ICs (e.g., containing different types of circuitry or are configured for different functionalities).

Figure 9:
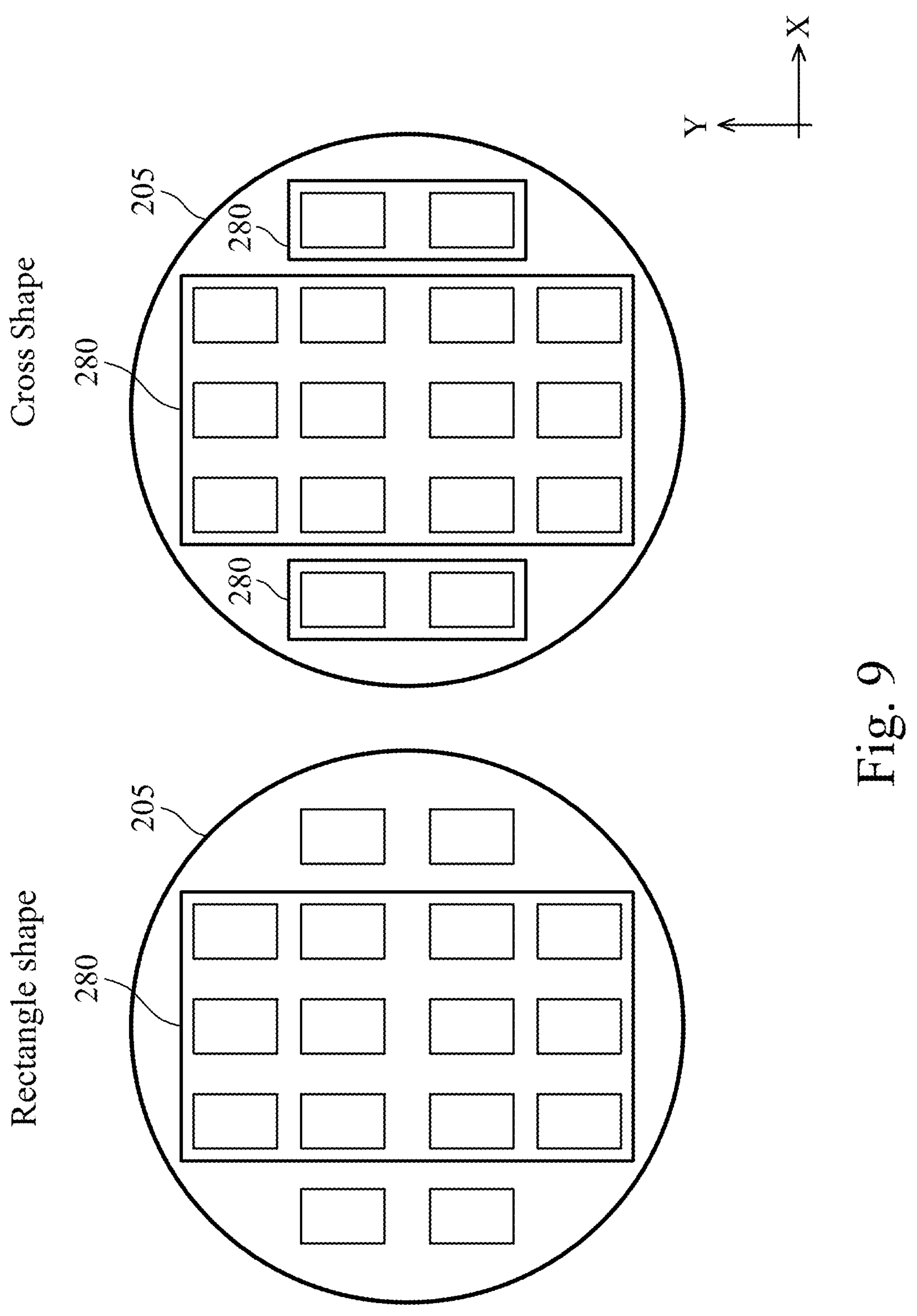

Another aspect of the present disclosure is directed to fabricating a "super-die" that is a wafer-level structure that includes most, if not all, of the IC dies on a wafer. For example, in some embodiments, the IC dies formed as a part of the "super-die" structure may constitute between 50%-100% of all IC dies formed on a single wafer. For example, as shown in FIG. 9, where the seal ring 280 is rectangularly-shaped, the above ratio may be between about 65% and about 75%. However, in an embodiment where the seal ring 280 is cross-shaped, also shown in FIG. 9, the above ratio may be higher than 75%.

Figure 10:
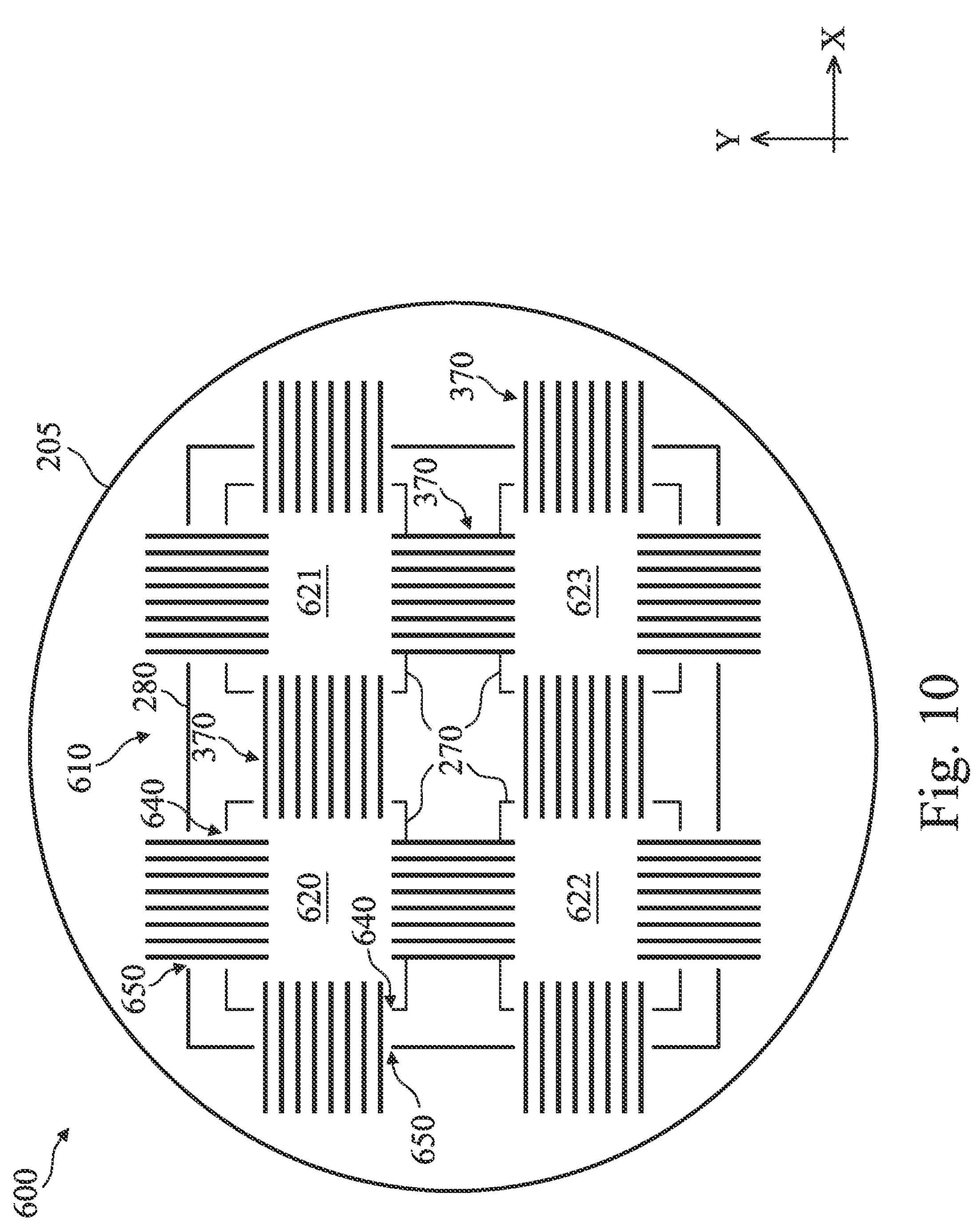

FIG. 10 illustrates a simplified top view of a wafer 600 that includes a multi-die structure 610 as an example embodiment of such a "super-die". As shown in FIG. 10, the multi-die structure 610 includes a plurality of IC dies, such as IC dies 620-623, that are arranged into an array having an M number of rows and an N number of columns. M and N are integers greater than 2. In some embodiments, M and N may each be in a range between 7 and 16. For reasons of simplicity and clarity, the multi-die structure 610 in FIG. 10 has 2 rows and 2 columns (and thus 4 IC dies), thereby forming a 2-by-2 array, though it is understood that the multi-die structure 610 as an actually fabricated structure may include a far greater number of rows and/or columns (and therefore hundreds, if not thousands, of IC dies). In some embodiments, all of the IC dies formed on the wafer 600 are located within the multi-die structure 610. In other embodiments, the wafer 600 may include a small number of other IC dies (e.g., less than 10% of the number of IC dies of the multi-die structure 610) that are not a part of the multi-die structure 610, but for reasons of simplicity, these other IC dies are not specifically shown in the embodiment of FIG. 10.

Similar to the IC dies 220-229 discussed above, the IC dies 620-623 each contains electrical circuitry, which may be implemented using a plurality of transistors such as FinFET devices or GAA devices that are formed over a substrate. Also similar to the IC dies 220-229, each of the IC dies 620-623 is surrounded in the top view by a respective one of the seal rings 270, which may be considered an inner seal ring layer to protect their respective IC dies from moisture or other contaminants.

Each of the seal rings 270 includes one or more openings 640 that allow the conductive elements 370 to extend therethrough. As discussed above, since each seal ring 270 may be made up of vertical stacks of metal lines 310, vias 320 (disposed between the metal lines 310), and the conductive pads 340 disposed above the metal lines 310 (see FIG. 4 for example), the openings 640 may each correspond to (or be defined by) a discontinuity in such a vertical stack. For example, there may be a break in a metal line 310 in one of the metal layers, or a break in one of the conductive pads 340, which forms the opening 640 that allows the conductive element 370 to extend therethrough. A first subset of the conductive elements 370 that extend horizontally electrically couple the circuitries of two adjacent dies in a given row together. A second subset of the conductive elements 370 that extend vertically electrically couple the circuitries of two adjacent dies in a given column together. When this is repeated across a number of rows and columns, all of the IC dies of the multi-die structure 610 are electrically interconnected together. In some embodiments, the IC dies 620-623 are substantially identical to one another. For example, the IC dies 620-623 are designed using the same IC layouts and are fabricated using the same fabrication processes (e.g., using the same sets of lithography masks). By electrically interconnecting all the IC dies 620-623 together, the collective processing power and/or storage capacity may allow the multi-die structure 610 to function as an enhanced computer tool, such as a super-computer or a component thereof.

The multi-die structure 610 also includes the seal ring 280, which surrounds all of the IC dies 620-623, the seal rings 270, and the conductive elements 370 in the top view. The seal ring 270 serves as an outer seal ring layer to protect the IC dies 620-623, the seal rings 270, and the conductive elements 370 from moisture or other contaminants, or buffer them from the mechanical pressured exerted against the multi-die structure 610 during a singulation process. As shown in FIG. 10, the seal ring 280 may also include a plurality of openings 650 that allow a subset of the conductive elements 370 to extend therethrough. Similar to the opening 640 of the seal rings 270, the openings 650 of the seal ring 280 are also defined by discontinuities or gaps in the metal lines or conductive pads that collectively make up the seal ring 280.

In some embodiments, other structures, such as other IC dies (not illustrated herein), may be electrically interconnected to the IC dies within the multi-die structure 610 through the conductive elements 370 that extend through the openings 650. In other embodiments, there are no IC dies that are implemented outside the seal ring 280 on the wafer 600. In other words, all the IC dies are implemented within the multi-die structure 610 and are surrounded/protected by the seal ring 280. In such embodiments, it is unnecessary for the conductive elements 370 to extend outside the seal ring 280 through the openings 650, since there are no electrical components to interconnect outside the seal ring 280. Nevertheless, the openings 650 and the subsets of the conductive elements 370 that extend through them may still be preserved. This is because it is easier, for fabrication purposes, to repeat the formation of each IC die along with its respective seal ring 270 and the conductive elements 370 (which extend from all 4 sides of the IC die) a plurality of times across the rows and columns to form the components of the multi-die structure 610, including the IC dies at the edge (or directly adjacent to the seal ring 280). It would have been more complicated and more costly to design a different set of lithography masks just to account for the fact that the IC dies at the edges of the multi-die structure 610 do not need to form some of the conductive elements that would have extended out of the seal ring 280. Thus, the group of conductive elements 370 that extend outside of the seal ring 280 (even when they are not electrically coupled to any other IC die) may be considered an artifact of fabrication, as they do not serve any useful purpose in that scenario.

The end portions of these conductive elements may be sawed off or diced off in a singulation process, which is performed along the scribe lines outside of the seal ring 280, to separate the multi-die structure 610 from the rest of the wafer. Thus, how much the conductive elements 370 extend outside the seal ring 280 may be determined by how far the scribe line is located from the seal ring 280.

Figure 11:
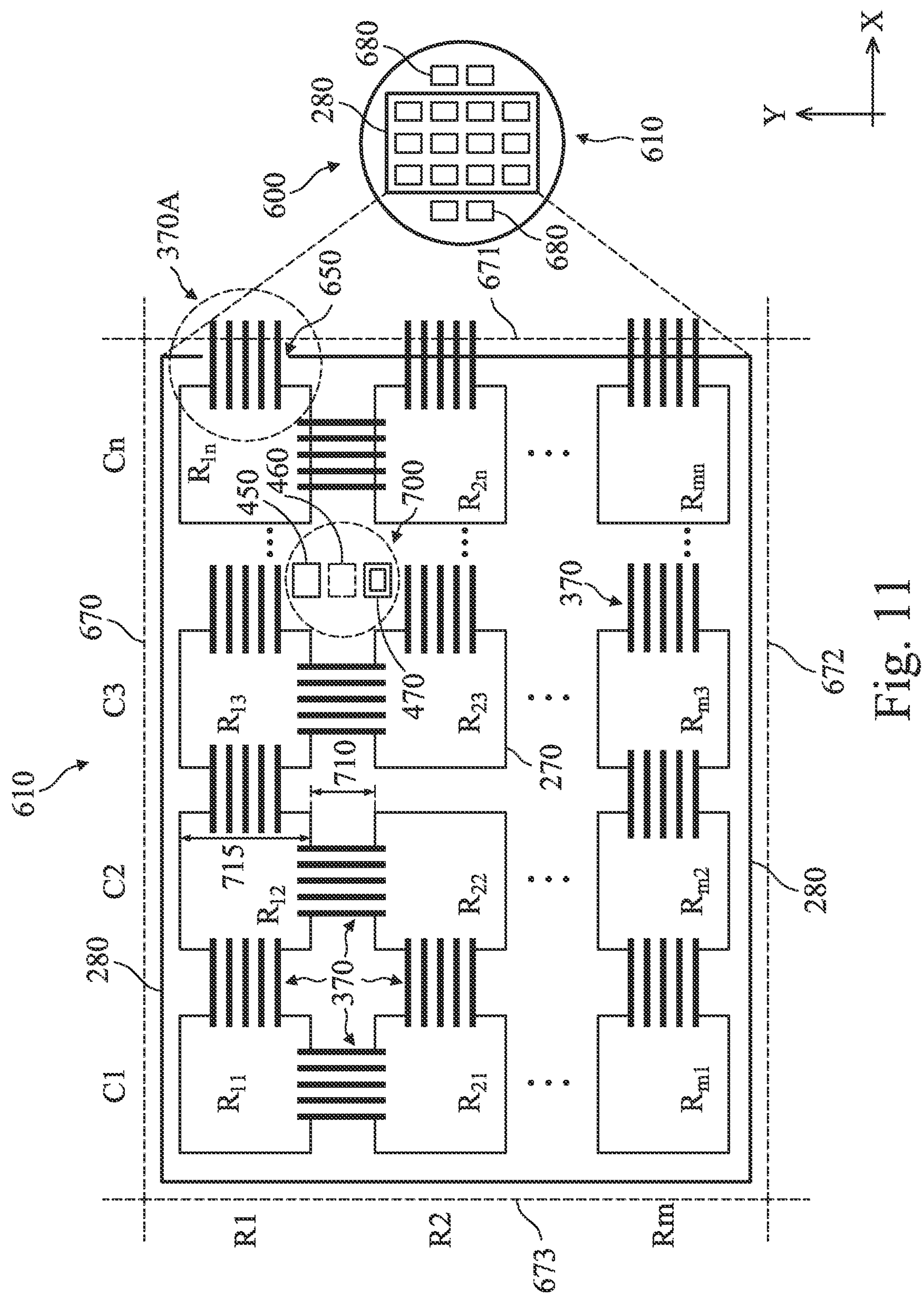

FIG. 11 illustrates another top view of the wafer 600 that includes an embodiment of the multi-die structure 610 and a magnified top view of the multi-die structure 610. The multi-die structure 610 includes an array of IC dies $R_{11}$-$R_{mn}$, arranged into an M number of rows (rows R1-Rm) and an N number of columns (columns C1-Cn). A subset of the conductive elements 370 extending in the X-direction electrically interconnect the IC dies in each row (e.g., the dies $R_{11}$-$R_{1n}$). Another subset of the conductive elements 370 extending in the Y-direction electrically interconnect the IC dies in each column (e.g., the dies $R_{11}$-$R_{m1}$).

As discussed above, the conductive elements extend into their respectively interconnected IC dies through openings in the seal rings 270 that surround each IC die. However, depending on design requirements, some of the IC dies within the multi-die structure 610 may not need to be interconnected together. For example, the IC die $R_{22}$ and the IC die $R_{23}$ need not be electrically coupled together, and therefore no conductive elements 370 are implemented directly between the IC die $R_{22}$ and the IC die $R_{23}$. In some embodiments, the IC dies $R_{11}$-$R_{mn}$ are substantially identical to one another, so as to augment the processing power and/or the storage capability of the multi-die structure 610 as a whole.

Also shown in FIG. 11 are the scribe lines 670, 671, 672, and 673 that are located on the 4 sides of the multi-die structure 610. Specifically, the scribe lines 670-673 are located in a region of the wafer 600 outside the seal ring 280. In a singulation process, a wafer dicing or sawing apparatus is used to dice or saw along the scribe lines 670-673 to separate the multi-die structure 610 from the rest of the wafer 600. Since the seal ring 280 is located inside the scribe lines 670-673, the seal ring 280 is preserved for the multi-die structure 610. As such, the seal ring 280 may help protect the microelectronic components within the multi-die structure 610 to withstand the mechanical forces (e.g., deformation forces) generated by the dicing or sawing process, in addition to protecting the microelectronic components from moisture or other contaminant particles.

In the embodiment shown in FIG. 11, other structures may be implemented on regions of the wafer 600 outside the multi-die structure 610. For example, structures 680 may be implemented in regions of the wafer 600 to the "left" and/or "right" of the multi-die structure 610. As an example, the structure 680 may include another IC die, which may or may not have the same IC design layout or functionality as the IC dies $R_{11}$-$R_{m1}$ within the multi-die structure 610. As another example, the structure 680 may include a test structure or measurement structure that contains electronic circuitry used to test or measure the performance or status of the components within the multi-die structure 610. As such, electrical connections between the structure 680 and the multi-die structure 610 may need to be established in some embodiments, at least while the multi-die structure 610 is still undergoing fabrication and before singulation occurs. For example, a subset of conductive elements 370A may be used to establish an electrical connection between one of the structures 680 and the IC die $R_{1n}$ within the multi-die structure 610. As shown in FIG. 11, an opening 650 of the seal ring 280 allows the conductive elements 370A to extend through the seal ring 280 in order to electrically interconnect the structures 680 and the IC die $R_{1n}$.

It is understood that in embodiments where the electrical connection between the multi-die structure 610 and external devices is no longer needed after the fabrication of the multi-die structure 610 has been completed, the singulation process discussed above may cut off portions of the conductive elements (e.g., the conductive elements 370A) that extend beyond the scribe lines (e.g., beyond the scribe line 671). Therefore, the final device of the multi-die structure 610 may include conductive elements 370 having sawed-off or diced-off end portions.

Some of the IC dies within the multi-die structure 610 need not be connected to any devices external to the multi-die structure 610. For example, no connections need to be made between any of the IC dies $R_{11}$-$R_{m1}$ and the structures 680 disposed to the "left" of the multi-die structure 610. For example, these structures 680 may be dummy features implemented for pattern uniformity purposes, or they may be alignment marks or overlay marks. Regardless, since these structures 680 do not need to be electrically interconnected to the IC dies $R_{11}$-$R_{m1}$, no conductive elements 370 need to be formed on the "left" side of the IC dies $R_{11}$-$R_{m1}$. Alternatively, even if conductive elements 370 are formed on the "left" side of the IC dies $R_{11}$-$R_{m1}$, they may have their end portions cut off along the scribe line 673 in the aforementioned singulation process.

Note that the conductive elements 370 may be implemented using any suitable shape or configuration, such as those shown in FIGS. 5-6. For example, the conductive elements 370 need not be straight and may include one or more angular turns instead, and they also may be implemented directly between the seal rings 270 and 280 (see FIG. 6). However, in most embodiments (such as the one illustrated in FIG. 11), it may be easier to implement the conductive elements 370 as straight rectangular components that are located directly between each pair of adjacently disposed IC dies within the multi-die structure 610. Such an implementation may leave the corner regions 700 otherwise empty, where the corner regions 700 refer to regions of the multi-die structure 610 located between the corners of 4 adjacently located IC dies. In order to further utilize these otherwise empty spaces, the dummy structures 450, the test structures 460, and/or the patterns 470 (e.g., alignment marks or overlay marks) may be implemented in the corner regions 700. As discussed above, the implementation of the dummy structures 450, the test structures 460, and/or the patterns 470 in the corner regions 700 may improve the pattern uniformity or other fabrication process related metric while the IC dies of the multi-die structure 610 undergo fabrication, and/or they may free up valuable chip real estate that would have been used inside the IC dies to implement equivalent or similar structures/patterns.

Another benefit achieved by implementing the multi-die structure 610 at the wafer-level is that more IC dies can be packed on a given wafer. In more detail, conventional wafer fabrication may form a plurality of IC dies on a given wafer, but at some point, these IC dies will need to be separated from one another (e.g., via a singulation process) and packaged separately before being sold as the finished product. To ensure that the singulation process does not accidentally damage the IC dies (e.g., by sawing into the IC dies, or causing too much mechanical duress to the IC dies even if the mechanical dicing/sawing tool does not directly cut into the IC dies), conventional wafer fabrication needs to reserve a sufficiently large spacing between the adjacently located IC dies. This may be referred to as a die-to-die spacing. Regions of the wafer corresponding to the die-to-die spacing may be considered wasted space, since no functional microelectronic components of the IC dies reside within such a space. As the semiconductor device scaling down process continues, the real estate on the wafer becomes more valuable, and thus it would be desirable to reduce the die-to-die spacing, so that more IC dies can be formed on a given wafer. Unfortunately, for conventional wafers, it is difficult to reduce the die-to-die spacing further, since the die-to-die spacing should exceed the width of the dicing/sawing tool (e.g., a blade), which may have a fixed size.

However, the IC dies formed as a part of the multi-die structure 610 can be packed much closer together, since they need not be individually packaged, meaning that no dicing/sawing tool needs to cut in the regions between the adjacently located IC dies. In other words, since no scribe line regions need to be implemented within the multi-die structure 610, and since very few other structures (if any) need to be formed on the wafer 600 outside of the multi-die structure 610, the IC dies within the multi-die structure can be formed much closer to nearby IC dies than what is possible in conventional wafers. The closer proximity between the IC dies herein may be represented by a ratio between a die-to-die spacing 710 and a dimension 715 of one of the IC dies. As a simplified example, the example die-to-die spacing 710 shown in FIG. 11 is the Y-direction distance between the IC die $R_{12}$ and the IC die $R_{22}$, and the dimension 715 is the Y-direction dimension of the IC die $R_{22}$ (which may be substantially the same for all the IC dies of the multi-die structure 610). It is understood that a similar die-to-die spacing and an IC die dimension may be extracted in the X-direction as well.

In any case, the ratio between the die-to-die spacing 710 and a dimension 715 for the multi-die structure 610 is smaller than a corresponding ratio in a conventional wafer. For example, in a conventional wafer where the IC dies have the same sizes as the IC dies $R_{11}$-$R_{mn}$ herein, the die-to-die spacing may be 2 to 4 times larger than the die-to-die spacing 710 herein, and as such, the ratio between the die-to-die spacing 710 and the dimension 715 may be about 2-4 times smaller than the corresponding ratio in a conventional wafer where the IC die sizes are the same (for an apples-to-apples comparison). Again, the smaller ratio herein is made possible by the fact that substantially all of the IC dies on the wafer 600 are formed within the multi-die structure 610 and therefore need not be individually diced and packaged. As such, the die-to-die spacing 710 may even be smaller than a width of the dicing/sawing tool used to perform the singulation process (which in the case of the multi-die structure 610, is only used to cut outside of the seal ring 280). Consequently, even if the wafer 600 has the same overall size as a conventional wafer, the number of IC dies that can be formed thereon can exceed the number of IC dies formed on the conventional wafer having the same size, at least part due to the fact that the IC dies can be arranged closer together. As such, the multi-die structure 610 can increase throughput and/or reduce fabrication costs.

Figure 12:
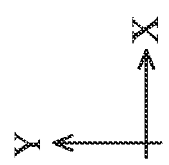
FIG. 12 illustrates top views of IC dies at different stages of fabrication according to various aspects of the present disclosure.
Figure 12:
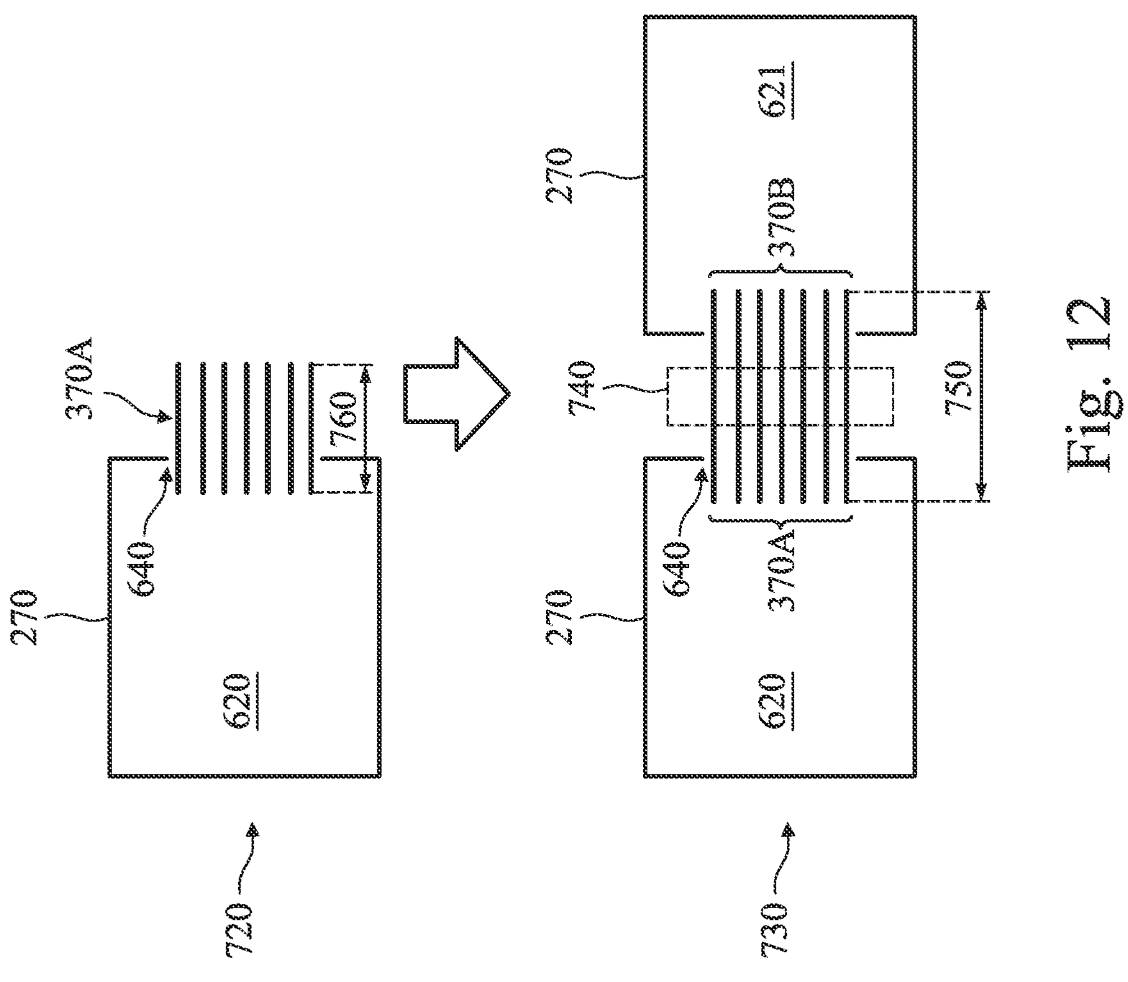

FIG. 12 illustrates top views of a portion of the multi-die structure 610 undergoing a fabrication process according to embodiments of the present disclosure. In a step 720, the IC die 620 is formed using a first set of lithography processes (e.g., exposure and developing processes), along with its seal ring 270, and a "left" portion of the conductive elements 370A. The "left" portion of the conductive elements 370A extend through the opening 640 of the seal ring 270 that surrounds the IC die 620. In a step 730, the IC die 621 (located to the "right" of the IC die 620 in the X-direction) is formed using a second set of lithography processes (e.g., exposure and developing processes), along with its seal ring 270, and a "right" portion of the conductive elements 370B. The "right" portion of the conductive elements 370B extend through the opening 640 of the seal ring 270 that surrounds the IC die 621.

The "left" portion of the conductive elements 370A and the "right" portion of the conductive elements 370B merge into each other in the X-direction at a region 740 to collectively form the conductive elements 370 that electrically interconnect the IC dies 620 and 621 together. To ensure the merger of the "left" and "right" portions of the conductive elements 370A and 370B, the "left" and "right" portions 370A and 370B are each initially configured with a sufficiently long length in the X-direction. For example, suppose that the finally formed conductive elements 370 each have a length 750 in the X-direction. In that case, the "left" and "right" portions 370A and 370B are configured such that they each have an initial length 760, where the initial length 760 is greater than ½ of the length 750. This configuration provides a margin of safety for the "left" and "right" portions 370A and 370B to merge, even if the imperfections of the fabrication processes cause the portions 370A and/or 370B to drift away from one another.

As discussed above, one of the problems of the conventional devices and the fabrication thereof is that, even though multiple dies may be formed on the same wafer, the connection between the dies is made after each die has been formed (e.g., after the dies have been singulated). This involves additional masking and processing. If two or more different kinds of dies need to be interconnected, it will drive up the fabrication costs and processing time, since the dies to be interconnected are formed by different processes, and existing seal rings formed around these individual dies may need to be broken up and reconnected.

Figure 13:
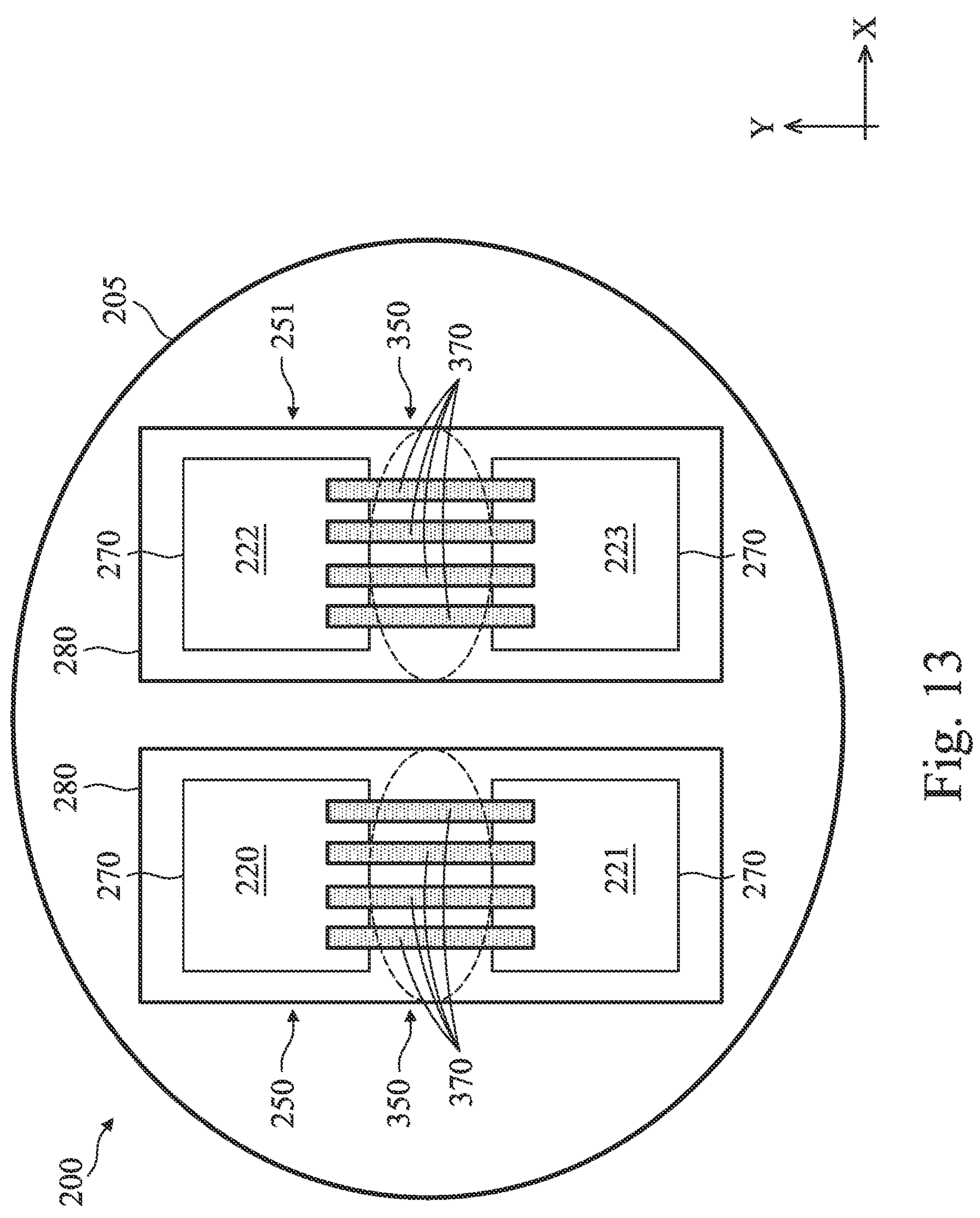
FIGS. 13-16 illustrate top views of a wafer-level structure and portions thereof according to various aspects of the present disclosure.

To overcome these problems, another aspect of the present disclosure involves forming and interconnecting different types of dies (each with their own seal rings) on the same wafer, and forming a seal ring to surround the interconnected dies, where the same mask or reticle may be used to perform the interconnection. As a result, fabrication time and costs will be reduced. For example, FIG. 13 illustrates a top view of an embodiment of the wafer-level structure 200 that helps illustrate the above concept. For reasons of clarity and consistency, similar components appearing in FIG. 13 and the previous figures (such as FIG. 2) will be labeled the same.

As shown in FIG. 13, the interconnected IC die 250 shown in the embodiment of FIG. 5 includes interconnected dies 250 and 251 that are formed on the wafer 205. The interconnected die 250 includes individual IC dies 220 and 221, which are circumferentially surrounded by their respective seal rings 270 in the top view. The interconnected IC die 250 itself is circumferentially surrounded by the seal ring 280 in the top view. In the illustrated embodiment, the IC dies 220 and 221 are the same type of dies. For example, they may each be a central processing unit (CPU). Meanwhile, the interconnected die 251 includes individual IC dies 222 and 223, which are also circumferentially surrounded by their respective seal rings 270 in the top view. The interconnected IC die 251 itself is circumferentially surrounded by another seal ring 280 in the top view. Unlike the interconnected die 250, however, the IC dies 222 and 223 are inhomogeneous, in that they are different type of dies and/or have different functionalities. For example, the IC die 222 may be a CPU, while the IC die 223 may be a memory device, such as a dynamic random-access memory (DRAM) device.

Although the IC dies 222 and 223 are different types of devices, their fabrication may be performed substantially at the same time, for example on the same wafer and using the same processing tools (though the transistors and interconnections formed on each of the IC dies 222 and 223 may be different). As such, processing cost and time will be substantially reduced compared to conventional processes where the IC dies 222 and 223 have to be fabricated separately.

It is understood that the implementation of the IC die 222 as a CPU and the IC die 223 as a DRAM device is merely a non-limiting example, and that the IC dies 222 and 223 may be flexibly implemented to be other different kinds of devices, and/or to have different functionalities, depending on design needs. In addition, the IC dies 222 and 223 may be implemented to have different sizes, regardless of whether they are the same type of IC die or not. For example, the IC dies 222 and 223 may each be a memory device, but the IC die 222 may have a greater or smaller footprint than the IC die 223 in the top view.

It is also understood that the gap region 350 still exists for both the interconnected IC die 250 and the interconnected IC die 251. Useful structures may be formed in the gap region 350. In the illustrated embodiment, the useful structures may include the conductive elements 370, which extend in the Y-direction to electrically interconnect the IC dies 220-221 together, or interconnect the IC dies 222-223 together. In other embodiments, the dummy structures 450, the test structures 460, and the patterns 470 (discussed above with reference FIG. 7) may also be implemented in the gap region 350.

Figure 14:
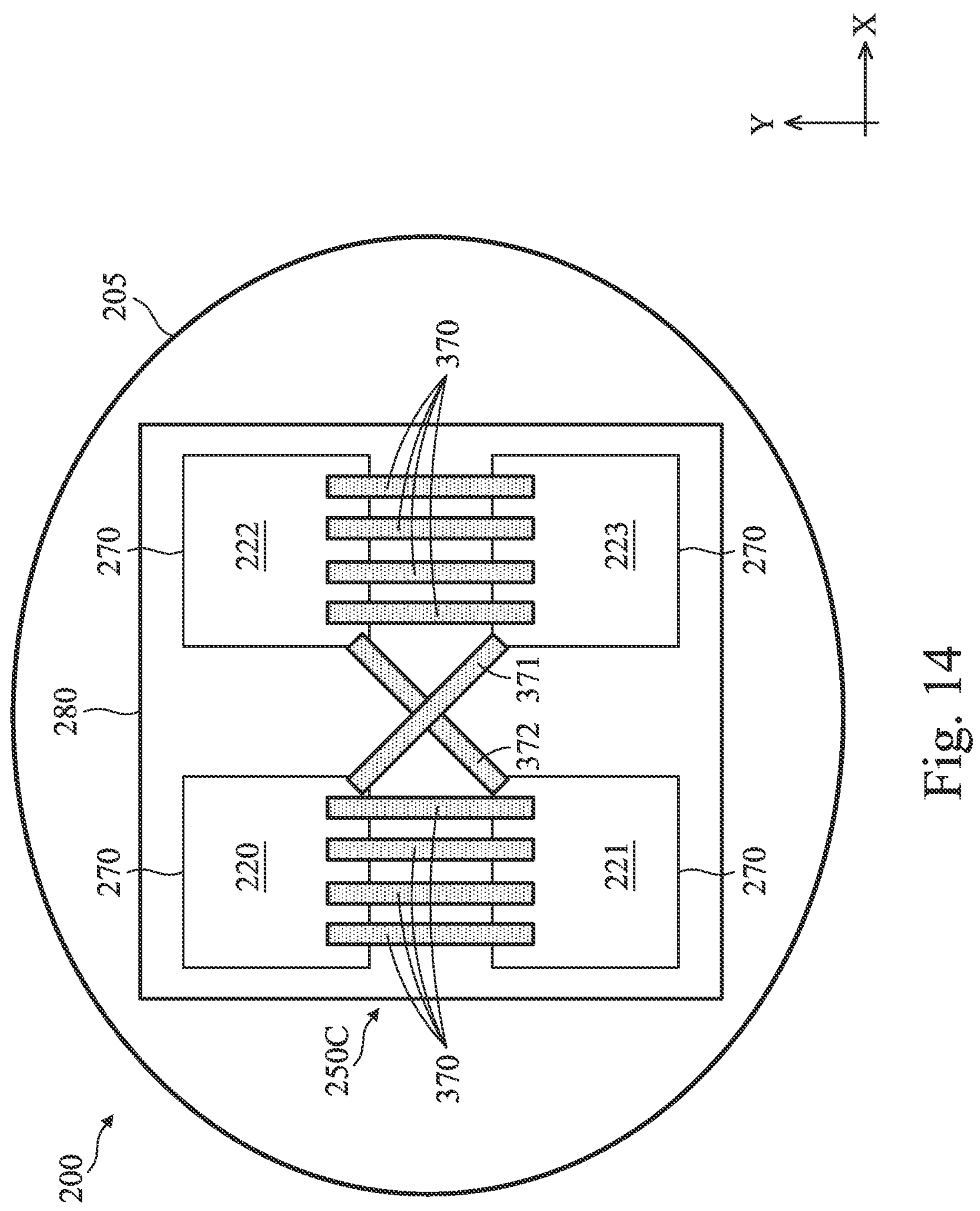

FIG. 14 illustrates a top view of another embodiment of the wafer-level structure 200 according to various aspects of the present disclosure. For reasons of clarity and consistency, similar components appearing in FIG. 2 and the previous figures will be labeled the same. As shown in FIG. 14, an interconnected IC die 250C formed on the wafer 205 includes four IC dies 220, 221, 222, and 223 that are electrically interconnected together. The IC dies 220-221 are electrically interconnected together by a first set of conductive elements 370, and the IC dies 222-223 are electrically interconnected together by a second set of conductive elements 370. In addition, the IC dies 220 and 223 are electrically interconnected together by a conductive element 371, and the IC dies 222 and 221 are electrically interconnected together by a conductive element 372. The conductive elements 371 and 372 extend in diagonal directions, since the IC dies 220 and 223 are diagonally disposed with respect to one another, as are the IC dies 221 and 222. In some embodiments, the diagonal directions are at 45 degrees from the X-direction or from the Y-direction. This is a more efficient way of electrically interconnecting the diagonally disposed IC dies 220-223 (or the diagonally disposed IC dies 221-222). It is understood that although a single conductive element 371 and a single element 372 are illustrated for reasons of simplicity, the conductive element 371 may include multiple conductive elements, and the same is true for the conductive element 372.

Figure 15:
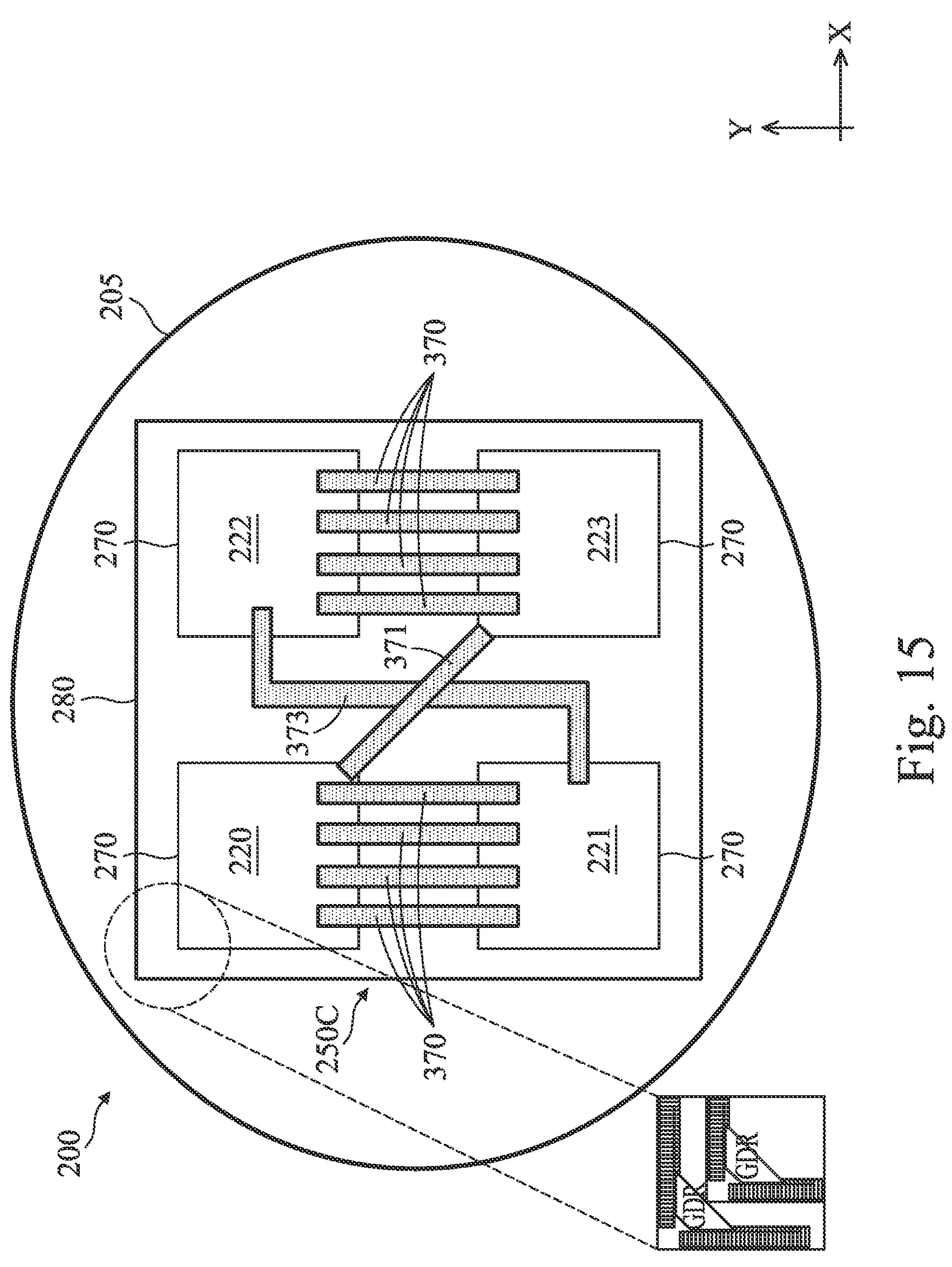

FIG. 15 illustrates a top view of yet another embodiment of the wafer-level structure 200 according to various aspects of the present disclosure. For reasons of clarity and consistency, similar components appearing in FIG. 14 and the previous figures will be labeled the same. As shown in FIG. 15, an interconnected IC die 250C formed on the wafer 205 includes four IC dies 220, 221, 222, and 223 that are electrically interconnected together. The IC dies 220-221 are electrically interconnected together by a first set of conductive elements 370, and the IC dies 222-223 are electrically interconnected together by a second set of conductive elements 370. In addition, the IC dies 220 and 223 are electrically interconnected together by the conductive element 371, which is diagonally disposed (e.g., extending partly in the X-direction and partly in the Y-direction). In other embodiments, the conductive element 371 can extend at any acute angle (e.g., any angle between 0 degrees and 90 degrees), as long as the process deviation is controlled to be within an acceptable range.

The IC dies 222 and 221 are electrically interconnected together by another conductive element 373. The conductive element 373 includes multiple segments, some which of which extends in the Y-direction, while others of which extend in the X-direction. By electrically interconnecting the diagonally-disposed IC dies 221-222 using the conductive element 373—which extend in the X-direction and the Y-direction but not in a diagonal direction—the embodiment herein can avoid a chip stress release (CSR) region. In that regard, a magnified view of the CSR region in also illustrated in FIG. 15, which may include any corner region of the IC dies 220-222. The CSR region includes a reinforcement portion of the seal ring for better protection at the corners of the IC dies 220-223. By avoiding the CSR regions, the embodiment herein can reduce the difficulty of the formation of the conductive element 373 (and/or other interconnection metals).

Figure 16:
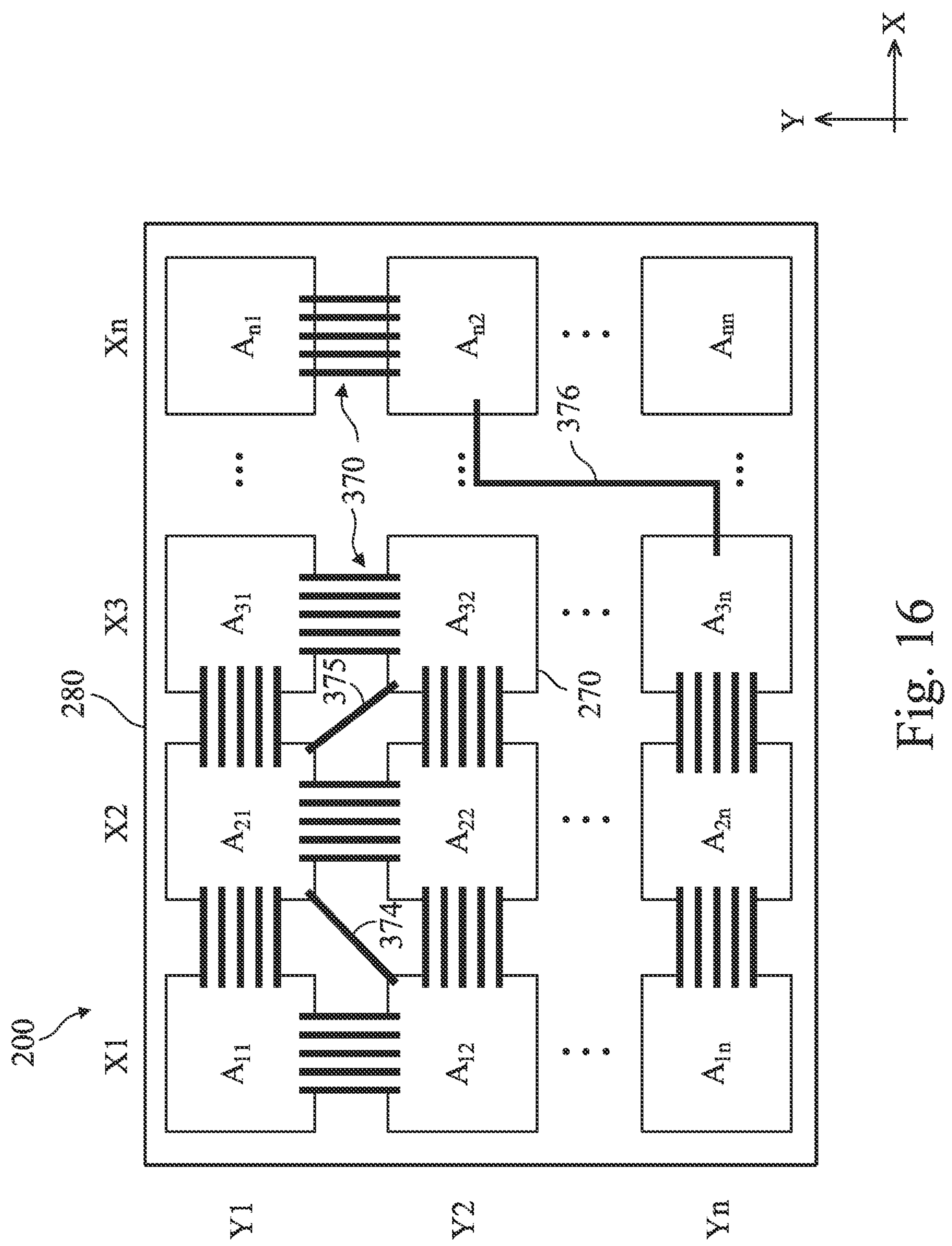

FIG. 16 illustrates a top view of another embodiment of the wafer-level structure 200 according to various aspects of the present disclosure. For reasons of clarity and consistency, similar components appearing in FIG. 16 and the previous figures will be labeled the same. As shown in FIG. 16, the wafer level structure 200 includes a multi-die structure similar to the multi-die structure 610 discussed above with reference to FIG. 11. For example, the wafer level structure 200 includes an array of IC dies $A_{11}$-$A_{nn}$ that are formed on the same wafer. The IC dies $A_{11}$-$A_{nn}$ are arranged into multiple rows $Y_1$-$Y_n$ and multiple columns $X_1$-$X_n$. Each of the IC dies $A_{11}$-$A_{nn}$ is circumferentially surrounded by a respective seal ring 270 in the top view, and the array of the IC dies collectively is circumferentially surrounded by the seal ring 280 in the top view.

Conductive elements 370 extend into the IC dies $A_{11}$-$A_{nn}$ to electrically interconnect them together. In addition, conductive elements 374, 375, and 376 are implemented to further interconnect IC dies that are not located immediately adjacent to one another in the X-direction or in the Y-direction. For example, the conductive element 374 extends in a diagonal direction to electrically interconnect IC dies $A_{12}$ and $A_{21}$, which are disposed diagonally adjacent to one another. As another example, the conductive element 375 extends in another diagonal direction to electrically interconnect IC dies $A_{21}$ and $A_{32}$, which are disposed diagonally adjacent to one another as well. As a further example, the conductive element 376 has multiple segments and extends both in the X-direction and in the Y-direction to electrically interconnect IC dies $A_{n2}$ and $A_{3n}$, which are disposed diagonally (but not adjacent) to one another, in that the IC dies $A_{n2}$ and $A_{3n}$ are separated in the Y-direction by multiple rows. In some embodiments, some of the IC dies $A_{11}$-$A_{nn}$ may also be different types or have different functionalities. For example, the IC die $A_{11}$ may be a CPU, while the IC die $A_{nn}$ may be a DRAM device. The IC dies $A_{11}$-$A_{nn}$ may also have different sizes.

Figure 17:
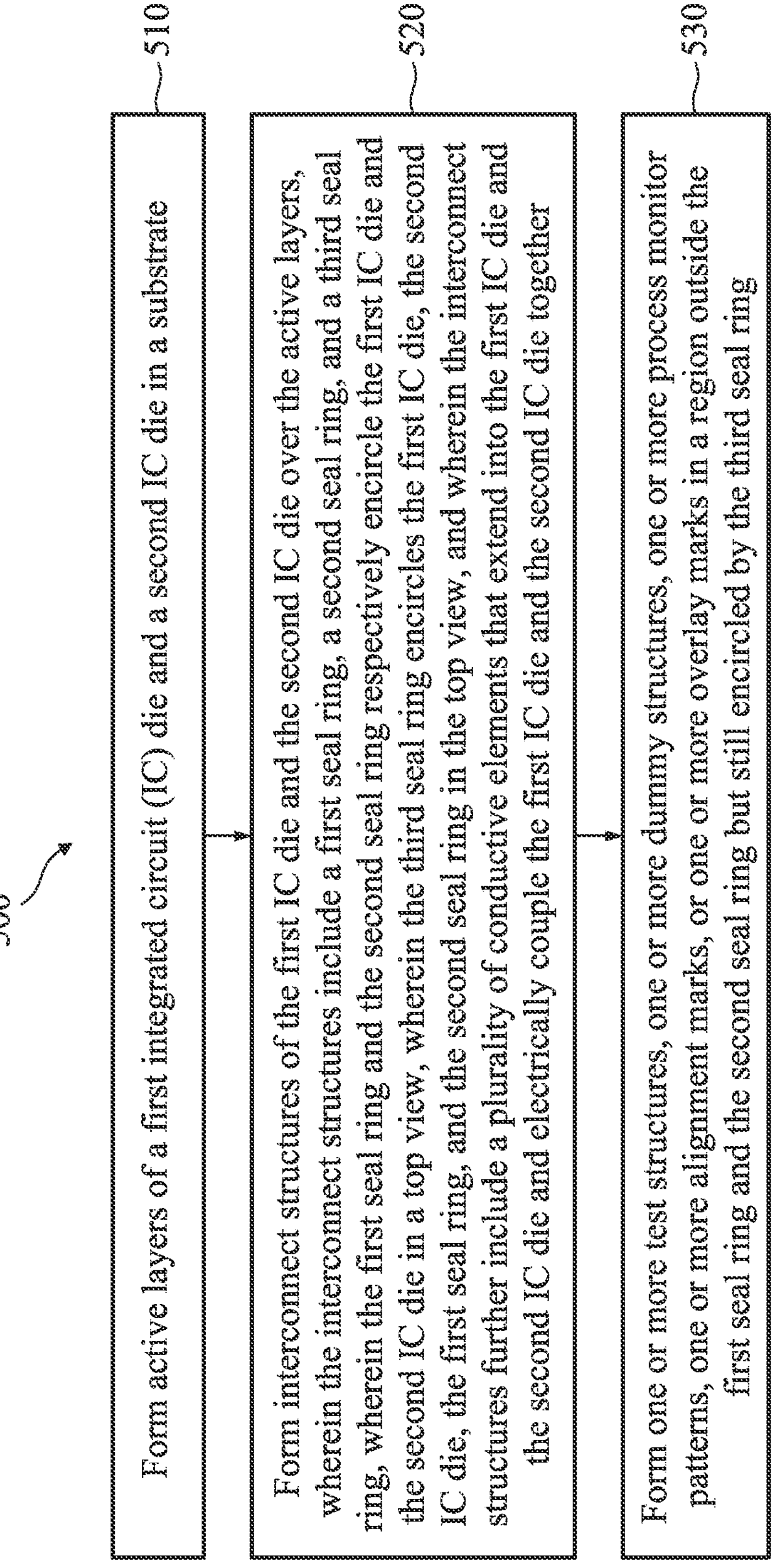
FIGS. 17-18 each illustrates a flowchart of a method according to various aspects of the present disclosure.

FIG. 17 is a flowchart illustrating a method 500 of fabricating a semiconductor device according to embodiments of the present disclosure. The method 500 includes a step 510 to form active layers of a first integrated circuit (IC) die and a second IC die in a substrate. Note that the first IC die and the second IC die are not yet fully formed at this point.

The method 500 includes a step 520 to form interconnect structures of the first IC die and the second IC die over the active layers. The interconnect structures include a first seal ring, a second seal ring, and a third seal ring. The first seal ring and the second seal ring respectively encircle the first IC die and the second IC die in a top view. The third seal ring encircles the first IC die, the second IC die, the first seal ring, and the second seal ring in the top view. The interconnect structures further include a plurality of conductive elements that extend into the first IC die and the second IC die and electrically couple the first IC die and the second IC die together.

The method 500 includes a step 530 to form one or more test structures, one or more dummy structures, one or more process monitor patterns, one or more alignment marks, or one or more overlay marks in a region outside the first seal ring and the second seal ring but still encircled by the third seal ring.

In some embodiments, the step 510 of forming the active layers is performed such that the first IC die and the second IC die are different types of IC dies or have different functionalities. For example, the first IC die may be a CPU, while the second IC die may be a DRAM.

In some embodiments, the first IC die and the second IC die are located diagonally with respect to one another, and the step 520 of forming the interconnect structures is performed such that the conductive elements extend diagonally into the first IC die or into the second IC die.

It is understood that the method 500 may include further steps performed before, during, or after the steps 510-530. For example, the method 500 may include wafer testing, singulation, and packaging processes. For reasons of simplicity, these additional steps are not discussed herein in detail.

Figure 18:
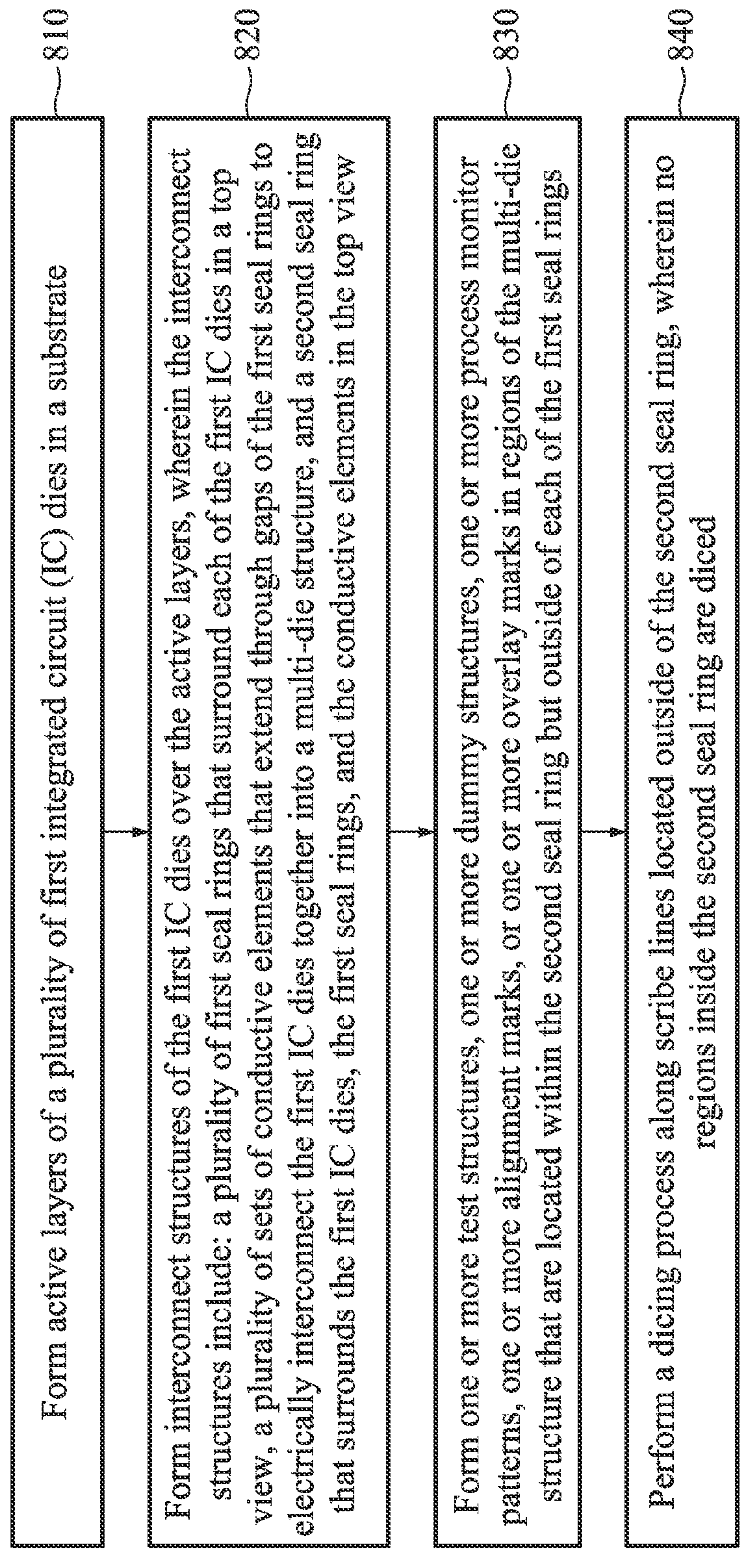

FIG. 18 is a flowchart illustrating a method 800 of fabricating a semiconductor device according to embodiments of the present disclosure. The method 800 includes a step 810 to form active layers of a plurality of first integrated circuit (IC) dies over a substrate.

The method 800 includes a step 820 to form interconnect structures of the first IC dies over the active layers. The interconnect structures include: a plurality of first seal rings that surround each of the first IC dies in a top view, a plurality of sets of conductive elements that extend through gaps of the first seal rings to electrically interconnect the first IC dies together into a multi-die structure, and a second seal ring that surrounds the first IC dies, the first seal rings, and the conductive elements in the top view.

The method 800 includes a step 830 to form one or more test structures, one or more dummy structures, one or more process monitor patterns, one or more alignment marks, or one or more overlay marks in regions of the multi-die structure that are located within the second seal ring but outside of each of the first seal rings.

The method 800 includes a step 840 to perform a dicing process along scribe lines located outside of the second seal ring. No regions inside the second seal ring are diced.

In some embodiments, the first seal rings comprises forming a plurality of vertical stacks of metal lines and vias disposed between the metal lines.

In some embodiments, each of the conductive elements has a first length, and wherein each set of the conductive elements is formed by: performing a first exposure process to define a first segment of each of the conductive elements in the set, the first segment having a second length that is greater than 50% of the first length; an performing a second exposure process to define a second segment of each of the conductive elements in the set, the second segment having a third length that is greater than 50% of the first length. Portions of the first segment and the second segment overlap with and merge into one another. It is understood that the method 800 may include further steps performed before, during, or after the steps 810-840. For example, the method 800 may include steps of testing and packaging the first IC dies. For reasons of simplicity, these additional steps are not discussed herein in detail.

Figure 19:
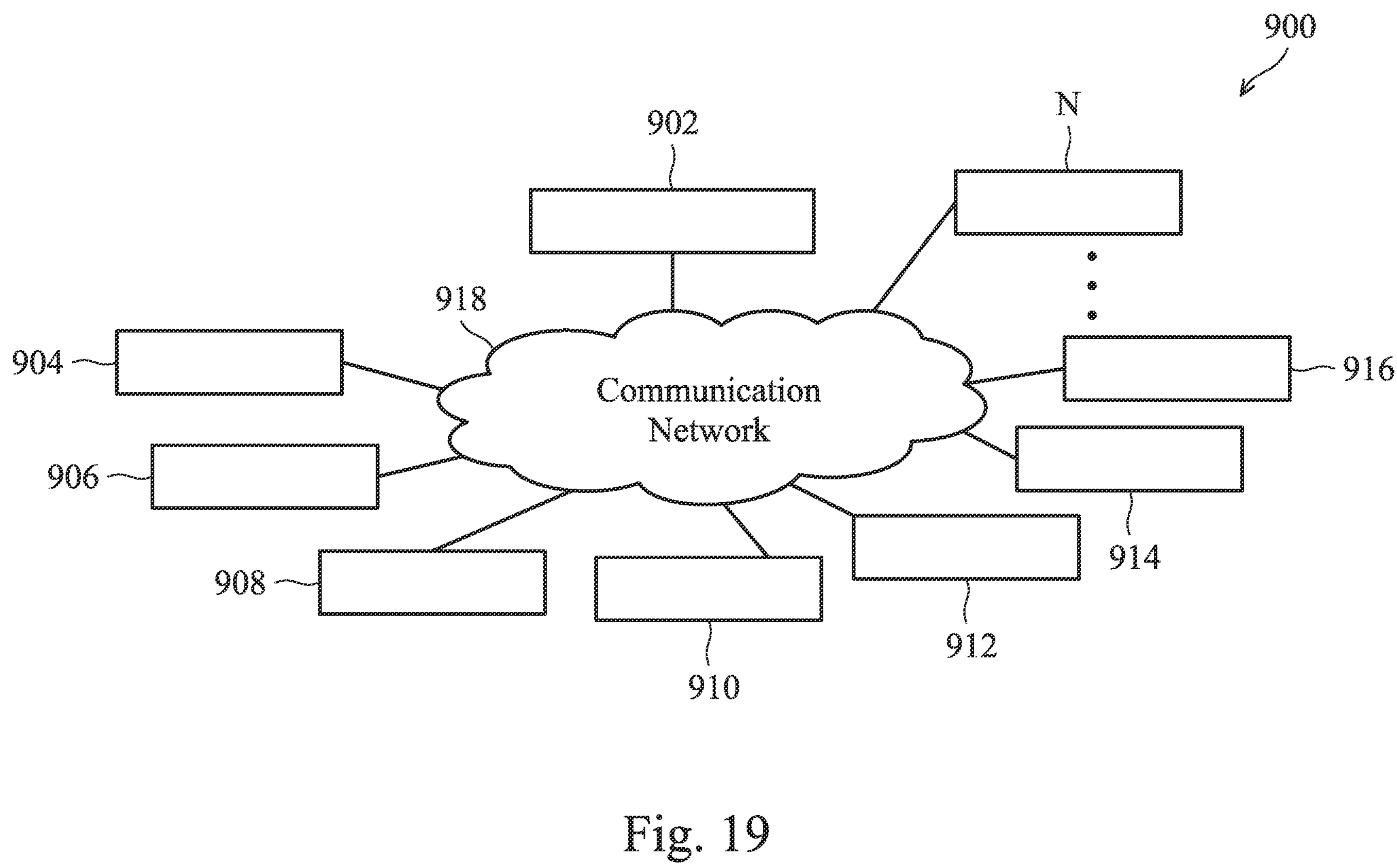
FIG. 19 is a block diagram of a manufacturing system according to various aspects of the present disclosure.

FIG. 19 illustrates an integrated circuit fabrication system 900 according to embodiments of the present disclosure. The fabrication system 900 includes a plurality of entities 902, 904, 906, 908, 910, 912, 914, 916 . . . , N that are connected by a communications network 918. The network 918 may be a single network or may be a variety of different networks, such as an intranet and the Internet, and may include both wire line and wireless communication channels.

In an embodiment, the entity 902 represents a service system for manufacturing collaboration; the entity 904 represents an user, such as product engineer monitoring the interested products; the entity 906 represents an engineer, such as a processing engineer to control process and the relevant recipes, or an equipment engineer to monitor or tune the conditions and setting of the processing tools; the entity 908 represents a metrology tool for IC testing and measurement; the entity 910 represents a semiconductor processing tool, such an EUV tool that is used to perform lithography processes to define the gate spacers of an SRAM device; the entity 912 represents a virtual metrology module associated with the processing tool 910; the entity 914 represents an advanced processing control module associated with the processing tool 910 and additionally other processing tools; and the entity 916 represents a sampling module associated with the processing tool 910.

Each entity may interact with other entities and may provide integrated circuit fabrication, processing control, and/or calculating capability to and/or receive such capabilities from the other entities. Each entity may also include one or more computer systems for performing calculations and carrying out automations. For example, the advanced processing control module of the entity 914 may include a plurality of computer hardware having software instructions encoded therein. The computer hardware may include hard drives, flash drives, CD-ROMs, RAM memory, display devices (e.g., monitors), input/output device (e.g., mouse and keyboard). The software instructions may be written in any suitable programming language and may be designed to carry out specific tasks.

The integrated circuit fabrication system 900 enables interaction among the entities for the purpose of integrated circuit (IC) manufacturing, as well as the advanced processing control of the IC manufacturing. In an embodiment, the advanced processing control includes adjusting the processing conditions, settings, and/or recipes of one processing tool applicable to the relevant wafers according to the metrology results.

In another embodiment, the metrology results are measured from a subset of processed wafers according to an optimal sampling rate determined based on the process quality and/or product quality. In yet another embodiment, the metrology results are measured from chosen fields and points of the subset of processed wafers according to an optimal sampling field/point determined based on various characteristics of the process quality and/or product quality.

One of the capabilities provided by the IC fabrication system 900 may enable collaboration and information access in such areas as design, engineering, and processing, metrology, and advanced processing control. Another capability provided by the IC fabrication system 900 may integrate systems between facilities, such as between the metrology tool and the processing tool. Such integration enables facilities to coordinate their activities. For example, integrating the metrology tool and the processing tool may enable manufacturing information to be incorporated more efficiently into the fabrication process or the APC module, and may enable wafer data from the online or in site measurement with the metrology tool integrated in the associated processing tool.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure. It is also understood that the various aspects of the present disclosure discussed above may apply to multi-channel devices such as Gate-All-Around (GAA) devices. To the extent that the present disclosure refers to a fin structure or FinFET devices, such discussions may apply equally to the GAA devices.

The present disclosure may offer advantages over conventional devices. However, it is understood that not all advantages are discussed herein, different embodiments may offer different advantages, and that no particular advantage is required for any embodiment. One advantage is that the improvement in chip area utilization. This is achieved by forming various structures in regions of a wafer that would otherwise be considered wasted space. For example, a wafer may include a plurality of first seal rings that each surround a respective IC die in a top view, where the first seal rings are then collectively surrounded by another second seal ring. Within the second seal ring, various structures are formed in the regions between the first seal rings, which would otherwise constitute wasted space. These structures may include conductive elements used to interconnect adjacent IC dies together, or dummy features used to improve pattern uniformity or other fabrication metrics, or test structures used to test the performance of the circuits on the wafer, or alignment marks or overlay marks used to gauge lithography accuracy/precision. By forming these structures in the otherwise-wasted regions of the wafer, they no longer need to be formed within the IC dies themselves, thereby freeing up valuable chip real estate for the formation of additional functional circuit elements therein.

Another advantage is that a multi-die structure may be formed as a wafer-level structure. For example, most, if not all, of the IC dies (each surrounded by its respective first seal ring) on a wafer may be electrically interconnected together and then surrounded by a second seal ring. This results in the formation of a “super-die” structure (or more generically referred to as a multi-die structure). Such a multi-die structure may offer superior performance and/or capability compared to conventional IC dies. For example, in embodiments where the multi-die structure is formed by electrically interconnecting a plurality of computer processor dies together (which may be substantially identical to one another), such a multi-die structure may offer much faster processing speed or greater processing power compared to conventional computer processor dies. The multi-die structure may even be used as a component of a super-computer. As another example, in embodiments where the multi-die structure is formed by electrically interconnecting a plurality of electronic memory storage dies (e.g., SRAM or DRAM) together, such a multi-die structure may offer much a much larger memory bank compared to conventional electronic memory storage dies. Furthermore, since the multi-die structure is formed and interconnected at a wafer level, they can be packed closer together, since they need not be cut and packaged into individual ICs. As such, the number of IC dies (as a part of the multi-die structure) that can be formed on a wafer with a given area is increased compared to conventional wafers where the IC dies have to be separately packaged. This may further increase the performance of the final structure and/or reduce the fabrication costs. Other advantages may include compatibility with existing fabrication processes (including for both FinFET and GAA processes) and the ease and low cost of implementation.

One aspect of the present disclosure pertains to a device. The device includes a first die that includes a plurality of first transistors. A first seal ring surrounds the first die in a top view. A second die that a plurality of second transistors. A second seal ring surrounds the second die in the top view. A plurality of conductive elements extends into both the first die and the second die in the top view. The conductive elements electrically interconnect the first die with the second die. A third seal ring surrounds, in the top view, the first die, the second die, and the conductive elements.

Another aspect of the present disclosure pertains to a wafer level structure. The wafer level structure includes a plurality of integrated circuit (IC) dies. Each of the IC dies contains electrical circuitry. A plurality of first seal ring structures each surrounds a respective one of the IC dies in a top view. A second seal ring structure surrounds a subset of the IC dies in the top view. The first seal ring structures surrounding each of the IC dies are also surrounded by the second seal ring structure in the top view. A plurality of conductive elements is surrounded by the second seal ring structure in the top view. The conductive elements electrically couple the subset of IC dies with one another. At least a first subset of the conductive elements each extend in a first horizontal direction in a top view. At least a second subset of the conductive elements each extend diagonally with respect to the first horizontal direction in the top view.

Yet another aspect of the present disclosure pertains to a method. Active layers of a first integrated circuit (IC) die and a second IC die are formed in a substrate. Interconnect structures of the first IC die and the second IC die are formed over the active layers. The interconnect structures include a first seal ring, a second seal ring, and a third seal ring. The first seal ring and the second seal ring respectively encircle the first IC die and the second IC die in a top view. The third seal ring encircles the first IC die, the second IC die, the first seal ring, and the second seal ring in the top view. The interconnect structures further include a plurality of conductive elements that extend into the first IC die and the second IC die and electrically couple the first IC die and the second IC die together. One or more test structures, one or more dummy structures, one or more process monitor patterns, one or more alignment marks, or one or more overlay marks are formed in a region outside the first seal ring and the second seal ring but still encircled by the third seal ring.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a first die that includes a plurality of first transistors;

a first seal ring that surrounds the first die in a top view;

a second die that includes a plurality of second transistors;

a second seal ring that surrounds the second die in the top view;

a plurality of conductive elements that extend into both the first die and the second die in the top view, wherein the conductive elements electrically interconnect the first die with the second die; and a third seal ring that surrounds, in the top view, the first die, the second die, and the conductive elements, wherein the third seal ring includes a plurality of metal lines and a plurality of vias disposed between the metal lines in a side view;

wherein:

the first die or the second die includes a plurality of additional metal lines;

at least one of the additional metal lines has a first width;

a first spacing separates at least one adjacent ones of the additional metal lines;

the first width and the first spacing are measured in a first direction in the top view;

a portion of a first one of the conductive elements is located in a region outside the first seal ring and the second seal ring in the top view and has a second width that exceeds the first width;

a second spacing separates portions of adjacent ones of the conductive elements that are located outside the first seal ring and the second seal ring in the top view;

the second width and the second spacing are measured in a second direction different from the first direction in the top view; and the second spacing exceeds the first spacing.

2. The device of claim 1, wherein at least one of the first seal ring and the second seal ring includes a plurality of respective further metal lines and a plurality of respective further vias disposed between the further metal lines vertically.

3. The device of claim 2, wherein for both the first seal ring and the second seal ring, at least one metal layer is discontinuous in the top view.

4. The device of claim 3, wherein with respect to the at least one metal layer:

the first seal ring includes a plurality of first gaps in the top view;

the second seal ring includes a plurality of second gaps in the top view; and at least some of the plurality of conductive elements extend through a respective one of the first gaps and a respective one of the second gaps.

5. The device of claim 1, wherein the third seal ring is continuous in the top view.

6. The device of claim 1, wherein at least one of the conductive elements has a plurality of angular turns in the top view, or wherein at least one of the conductive elements extends in a diagonal direction.

7. The device of claim 1, wherein:

the first die and the second die are spaced apart in at least a first direction; and at least some of the conductive elements extend into the first die or into the second die in at least a second direction different from the first direction.

8. The device of claim 1, further comprising: one or more dummy structures, one or more test structures, one or more process monitor patterns, one or more alignment marks, or one or more overlay marks that are disposed between the first die and the second die in the top view.

9. The device of claim 1, further comprising:

one or more additional dies outside the first seal ring and the second seal ring but within the third seal ring; and a plurality of additional conductive elements that interconnect the one or more additional dies to the first die or to the second die.

10. The device of claim 1, the first die and the second die are different types of dies or have different functionalities.

11. The device of claim 1, wherein:

the device is a wafer-level structure on which a plurality of dies, including the first die and the second die, are implemented;

the wafer-level structure further includes at least one third die that is located outside of the third seal ring and is surrounded by a fourth seal ring in the top view; and the third die is not electrically interconnected to any other die on the wafer-level structure.

12. The device of claim 1, wherein the first direction is perpendicular to the second direction in the top view.

13. The device of claim 1, wherein:

a ratio of the second width and the first width is in a range between about 2:1 and about 4:1; and a ratio of the second spacing and the first spacing is in a range between about 2:1 and about 4:1.

14. A wafer-level structure, comprising:

a plurality of integrated circuit (IC) dies, wherein at least some of the IC dies contains electrical circuitry;

a plurality of first seal ring structures that surround different ones of the IC dies in a top view;

a second seal ring structure that surrounds a subset of the IC dies in the top view, wherein the first seal ring structures surrounding the IC dies are also surrounded by the second seal ring structure in the top view, and wherein the first seal ring structures or the second seal ring structure includes a vertical stack of metal layers interconnected by vias in a side view; and a plurality of conductive elements surrounded by the second seal ring structure in the top view, wherein the conductive elements electrically couple the subset of IC dies with one another;

wherein:

the IC dies include a plurality of metal lines that have respective first widths and are spaced apart from adjacent metal lines by respective first distances;

the first widths and the first distances are measured in a first direction in the top view;

the conductive elements have respective second widths and are spaced apart from adjacent conductive elements by respective second distances;

the second widths and the second distances are measured in a second direction different from the first direction in the top view;

at least one of the second widths is greater than at least one of the first widths; and at least one of the second distances is greater than at least one of the first distances.

15. The wafer-level structure of claim 14, wherein:

at least one of the first seal ring structures surrounded by the second seal ring structure includes a discontinuity; and the conductive elements extend into the IC dies surrounded by the second seal ring structure through the discontinuity of the first seal ring structures.

16. The wafer-level structure of claim 14, wherein the wafer-level structure further comprises: one or more dummy structures, one or more test structures, one or more process monitor patterns, one or more alignment marks, or one or more overlay marks that are surrounded by the second seal ring structure in the top view but are disposed outside of the first seal ring structures in the top view.

17. The wafer-level structure of claim 14, wherein at least some of the IC dies of the plurality of IC dies are different types of IC dies or have different functionalities than other IC dies of the plurality of IC dies.

18. A device, comprising:

a first die that includes a plurality of first transistors;

a first seal ring located around the first die in a top view;

a second die that includes a plurality of second transistors, wherein the first die and the second die are different types of dies or have different functionalities;

a second seal ring located around the second die in the top view;

a plurality of first conductive elements that extend into both the first die and the second die in the top view, wherein the first conductive elements are electrically coupled to both the first die and the second die; and a third seal ring disposed around the first seal ring, the second seal ring, and the first conductive elements in the top view;

wherein:

the first seal ring, the second seal ring, and the third seal ring include a plurality of respective second conductive elements and a plurality of respective vias disposed between the second conductive elements vertically in a cross-sectional side view;

at least one of the first die or the second die includes a plurality of metal lines;

at least one of the metal lines has a first width;

the metal lines are spaced apart from adjacent metal lines by a respective first spacing;

the first width and the first spacing are measured in a first direction in the top view;

at least one of the first conductive elements has a respective second width that exceeds the first width;

the first conductive elements are spaced apart from adjacent first conductive elements by a respective second spacing that exceeds the first spacing; and the second width and the second spacing are measured in a second direction different from the first direction in the top view.

19. The device of claim 18, wherein at least one of the first seal ring, the second seal ring, and the third seal ring has a profile that resembles a respective rectangle in the top view.

20. The device of claim 18, wherein the third seal ring is continuous in the top view.

* * * * *